(12) United States Patent
Kato

(10) Patent No.: US 7,032,205 B2
(45) Date of Patent: Apr. 18, 2006

(54) LAYOUT AND WIRING SYSTEM AND RECORDING MEDIUM RECORDING THE WIRING METHOD

(75) Inventor: Toshikazu Kato, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 131 days.

(21) Appl. No.: 10/808,530

(22) Filed: Mar. 25, 2004

(65) Prior Publication Data

US 2004/0181765 A1    Sep. 16, 2004

Related U.S. Application Data

(62) Division of application No. 09/739,826, filed on Dec. 20, 2000, now Pat. No. 6,732,345.

(30) Foreign Application Priority Data

Dec. 21, 1999    (JP)    ............................ 11-363393

(51) Int. Cl.
*G06F 17/50*    (2006.01)
(52) U.S. Cl. ............... 716/11; 716/8; 716/9; 716/12
(58) Field of Classification Search ............ 815/2, 815/7–15
See application file for complete search history.

(56) References Cited

U.S. PATENT DOCUMENTS

| 5,416,722 | A | | 5/1995 | Edwards |
| 5,618,744 | A | | 4/1997 | Suzuki et al. |
| 5,798,937 | A | * | 8/1998 | Bracha et al. ............ 716/9 |
| 5,824,570 | A | | 10/1998 | Aoki et al. |
| 6,035,108 | A | * | 3/2000 | Kikuchi ................. 716/12 |
| 6,166,441 | A | | 12/2000 | Geryk |
| 6,207,986 | B1 | | 3/2001 | Yamanaka et al. |
| 6,341,366 | B1 | * | 1/2002 | Wang et al. ............. 716/11 |
| 6,546,540 | B1 | | 4/2003 | Igarashi et al. |
| 6,629,302 | B1 | * | 9/2003 | Miura et al. ............. 716/8 |

FOREIGN PATENT DOCUMENTS

| JP | 01-302856 A | 12/1989 |
| JP | 3-029343 | 2/1991 |
| JP | 10-294373 | 11/1998 |

* cited by examiner

*Primary Examiner*—Paul Dinh
(74) *Attorney, Agent, or Firm*—Foley & Lardner LLP

(57) ABSTRACT

It is determined whether a short-run rule can be adapted into a position, where a via cell is parallel and adjacent to a portion of wiring or another via cell. The via cell and the portion of the wiring is arrayed at the smallest space in the wiring. When determined that the short-run rule can be adapted thereto, via cell data is created. The via cell data includes a via margin which is so reduced in size that the via margin can be equal to or larger than the wiring minimum space. With the created via cell data, automatic layout and wiring is performed. The via cell data is replaced with art-work data including a via cell with an original via margin, so as to be output.

3 Claims, 20 Drawing Sheets

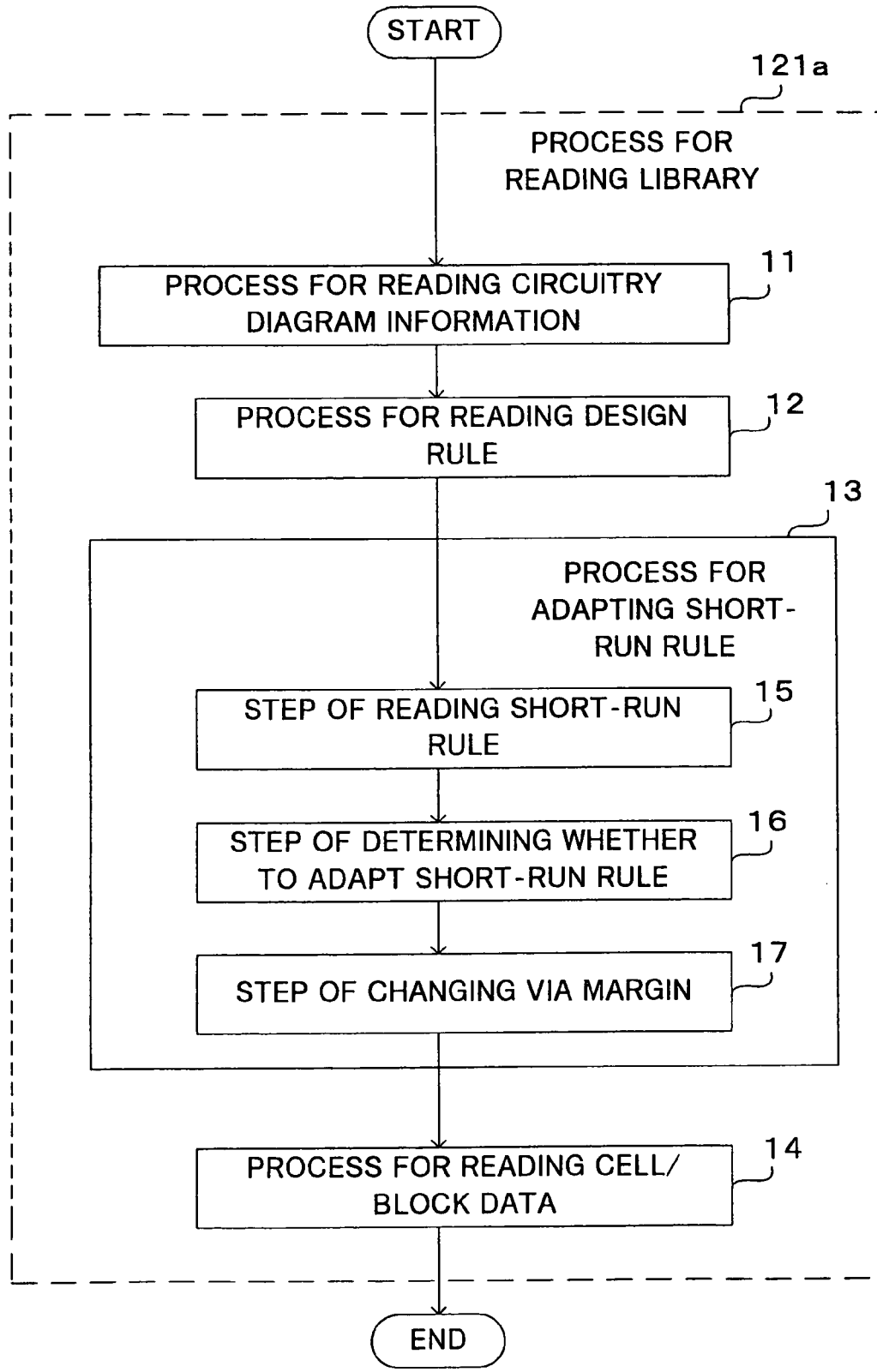

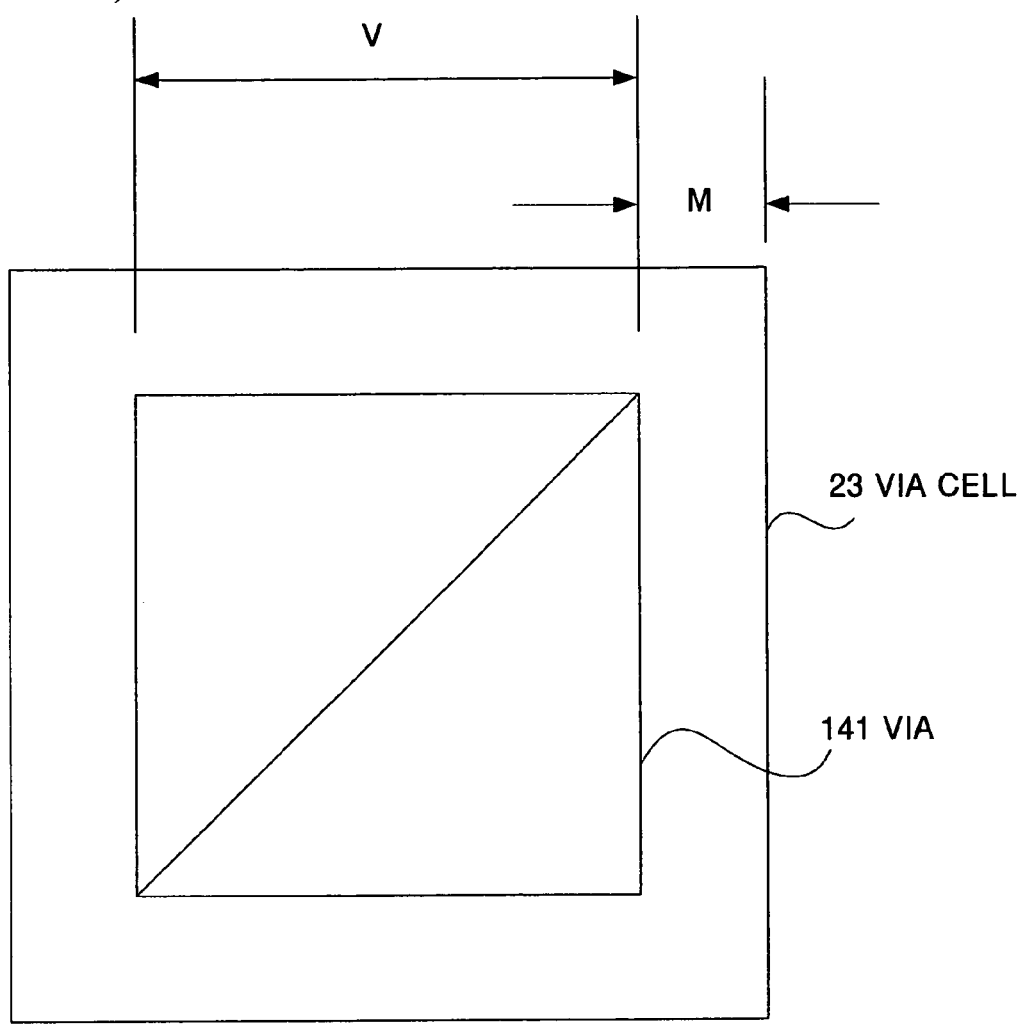

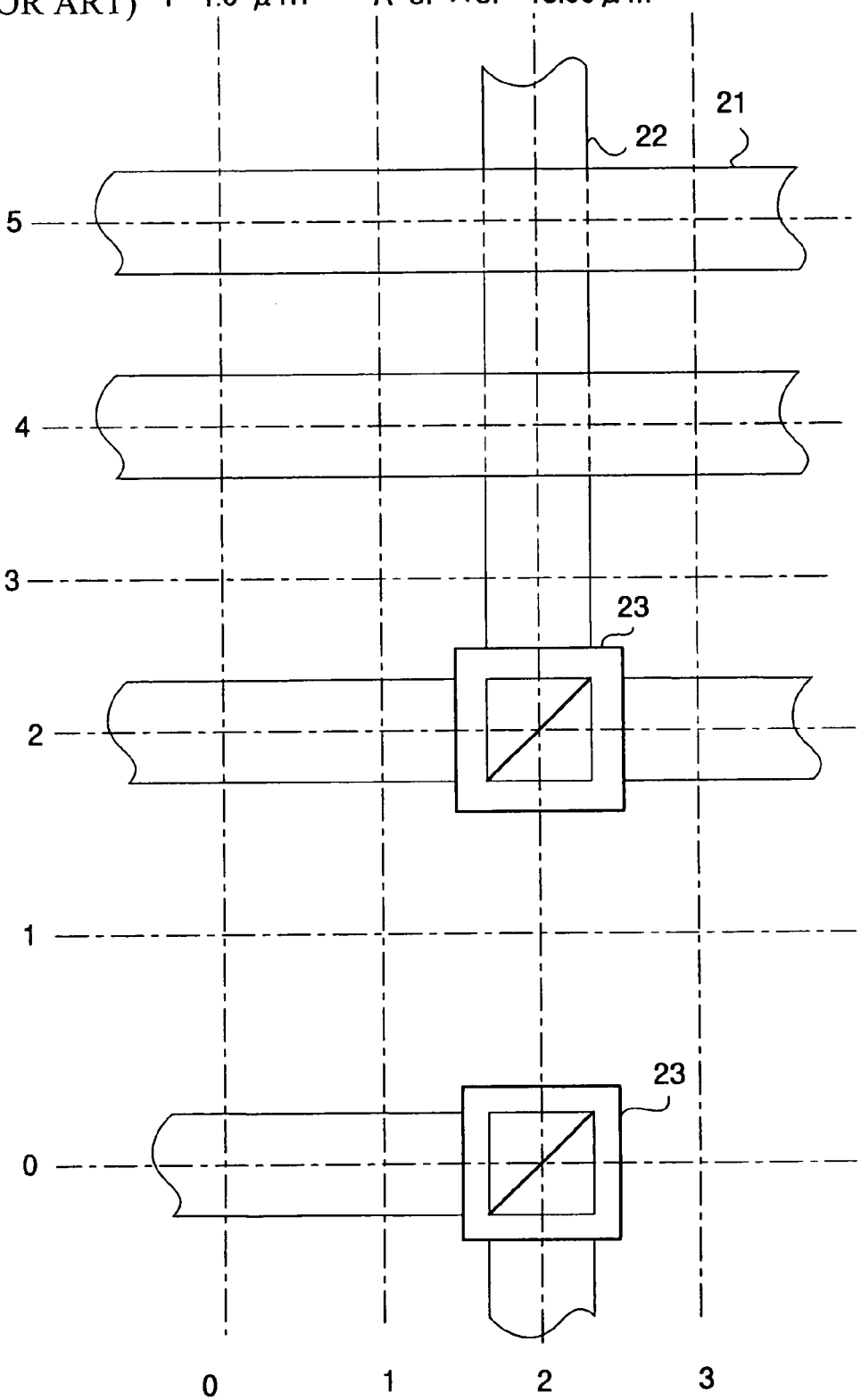

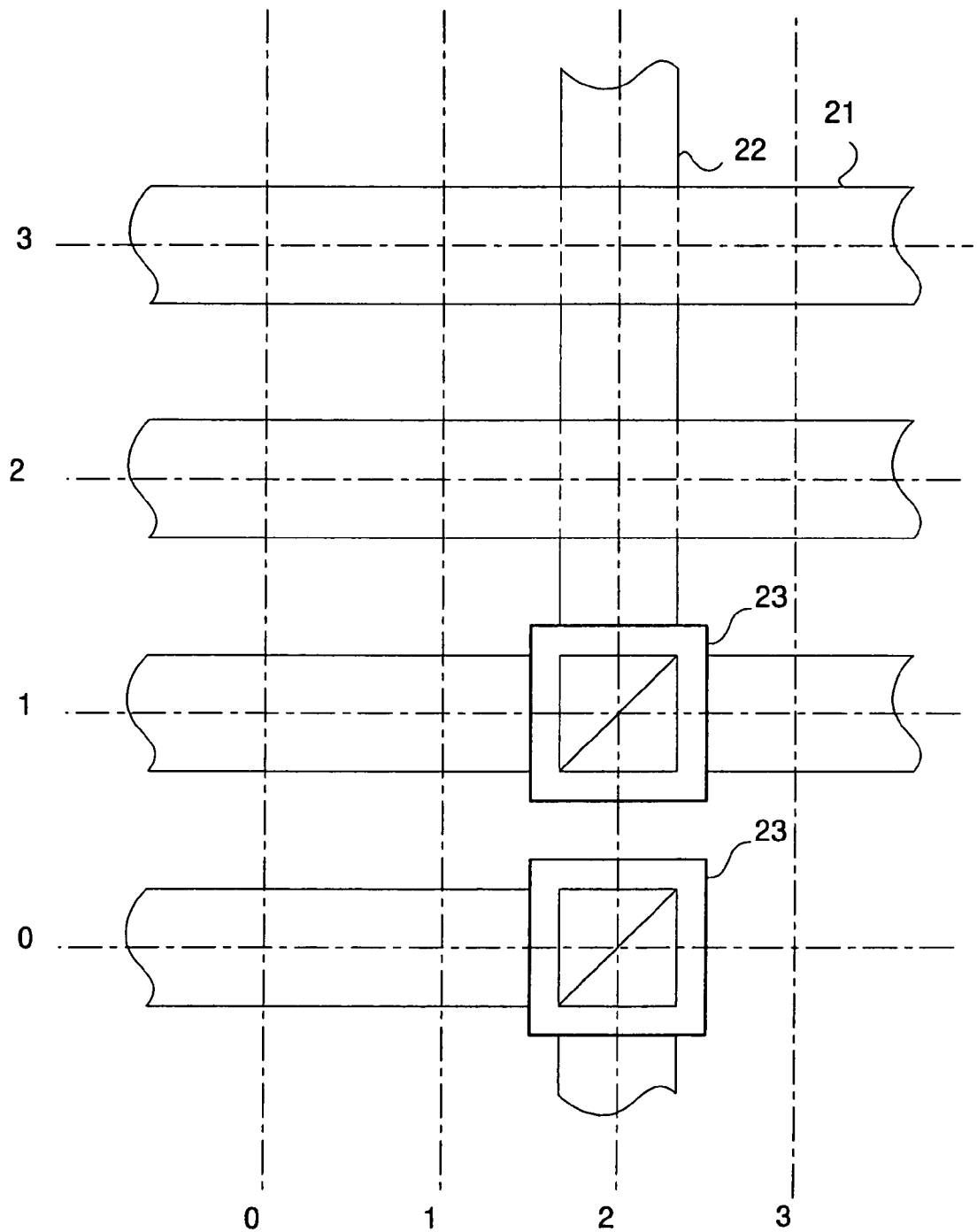

LAYOUT AND WIRING SYSTEM AND RECORDING MEDIUM RECORDING THE WIRING METHOD

CROSS-REFERENCE TO RELATED PATENT APPLICATIONS

This application is a divisional application of application Ser. No. 09/739,826, filed Dec. 20, 2000, and now U.S. Pat. No. 6,732,345. and based on Japanese Patent Application No. 11-363393, filed Dec. 21, 1999, by Toshikazu KATO. This application claims only subject matter disclosed in the parent application and therefore presents no new matter.

BACKGROUND OF THE INVENTION

1. Field of the Invention

The present invention relates to a layout and wiring system and a wiring method for use in the automatic layout and wiring system, and more particularly, to a layout and wiring system and a wiring method for use in the automatic layout and wiring system, capable of wiring electronic components in accordance with a short-run rule which partially allows a wiring space smaller than the wiring minimum space according to a design rule only if a predetermined condition is fulfilled, and a recording medium which records the wiring method for use in the automatic layout and wiring system.

2. Description of the Related Art

In an LSI (Large-Scale Integration) layout design, art-work data regarding the wiring in the entire chip is created based on data regarding the wiring in a library. The creation of such art-work data is performed based on the chip size and a circuitry diagram which are shown in the unit of logical functions (blocks) a collection of which are prepared as a library. The creation of such art-work data is performed using an automatic layout and wiring system as a CAD (Computer Aided Design) system. Along with the large scale and rapid development in the integration of the LSI chips in recent years, a higher degree of integration in automatic layout in automatic layout and wiring systems is desired. Hence, it is demanded that automatic layout and wiring systems include a wiring function for wiring a number of wiring layers and be able to wire electronic components even if a number of vias for connecting the wiring layers are included.

The structure of the conventionally-used automatic layout system and a process for automatically layout and wiring electronic components will now schematically be explained. FIG. 11 is a diagram showing the structure of the automatic layout and wiring system. In the automatic layout and wiring system 1, reading/previous-processing means 6 is prepared for: (1) reading information regarding the connection made between terminals of each block forming an LSI to be designed from a circuitry diagram information file 2; (2) reading art-work data regarding cells/blocks for use in the LSI to be designed, from information regarding vias or cells such as a NAND gate, etc. and registered in a cell/block library 3, and/or information including any blocks for realizing complicated logical functions; (3) and reading, from a design rule file 4, a design rule for wiring electronic components under some conditions, such as a wiring pitch between wiring layers, the wiring width, the wiring minimum space, and the size of each element forming a via cell, and for inspecting the above conditions. On the basis of the read information, main automatic layout and wiring means 7 creates data for laying out and wiring the cells/blocks, and carries out the process for laying out and wiring the cells/blocks. Resultant layout and wiring inspection means 8 inspects the resultant layout and wiring performed by the main automatic layout and wiring means 7. If there is no defect in the resultant wiring which has undergone the inspection, the data regarding the resultant wiring is re-converted into art-work data. Thereafter, the art-work data is output from the automatic layout and wiring system 1 to a layout and wiring result output file 5. On the contrary, if a defect is found during the inspection, the defect is corrected, and the process for laying out and wiring the cells/blocks is carried out again, by inputting/editing means (not illustrated) which is included in the automatic layout and wiring system 1.

FIG. 12 is a flow diagram for explaining the entire process for laying out and wiring electronic components. In a process 121 for reading a library, the automatic layout and wiring system reads out circuitry information, the wiring pitch, the wiring width, the wiring minimum space, the side length of each via, and information regarding blocks to be arrayed. Such information are registered in advance as library data in the circuitry diagram information file 2, the cell/block library 3, the design rule file 4. Further, the automatic layout and wiring system sets a rule for laying out and wiring the electronic components. In a process 122 for laying out cells/blocks, the primitive cells and the logical functional blocks, which are illustrated in the circuitry diagram, are automatically laid out in an LSI chip. In a process 123, for wiring cells/blocks, terminals between cells/blocks are automatically wired in accordance with a set rule. In a process 124, for inspecting wired cells/blocks, the electronic components are inspected as to whether there is an un-laid block, any unconnected portion of wiring, and whether there is a shorted circuit. In a process 125 for outputting data regarding the laid out and wired cells/blocks, data for the automatic layout and wiring system is converted into art-work data corresponding each wiring pattern forming an LSI, and the converted data is output to the layout and wiring result output file 5. Then, the entire process for laying out and wiring the electronic components is completed.

FIG. 13 is a flow diagram for specifically explaining the process 121, which is included in the entire process for laying out and wiring electronic components shown in FIG. 12. The conventional process 121 includes a process 131, for reading out circuitry diagram information from the circuitry diagram information file 2 and writing the read information into the automatic layout and wiring system, a process 132, for reading design rule information from the design rule file 14, and a process 133 for reading information regarding any cells/blocks for use in laying out and wiring the electronic components from the cell/block library 3.

The process 132, includes steps 134, 135, 136, 137 and 138. The step 134 is prepared for reading a wiring pitch P indicating a space between grid lines in the wiring. The step 135 is prepared for reading a wiring width W which is a standard level for signal wiring. The step 136 is prepared for reading the wiring minimum space S which is the allowable minimum value for a space between a portion of wiring and another portion of wiring. The step 137 is prepared for reading a side length V of a via in a via cell. The step 138 is prepared for reading a via margin M.

FIG. 14A is a planer view of a via cell, and FIG. 14B is a cross sectional view exemplarily showing a via cell included in an LSI. In a via cell 23 shown in FIG. 14A, a via 141 for connecting upper wiring with lower wiring is formed in a square shape having a side length V. As shown in FIG. 14B, a lower wiring layer 22a and an upper wiring layer 21a are larger in width than the wire by via margins M, which is prepared on all sides of the via 141, than the via 141. In this structure, the via 141 does not extend beyond the upper wiring layer 21 and the lower wiring layer 22a, even if the positional deviation occurs between the via and the lower wiring layer pattern and/or between the via and the upper wiring layer pattern in a lithography process during the LSI manufacture. A reference numeral 142 denotes an insulation layer such as a silicon oxide film, etc.

As shown in FIG. 13, the process 133 includes a step 139 of reading an art-work cell name of the via cell 23, and a step 140 of reading information regarding any cells/blocks for use in laying out and wiring the electronic components.

FIGS. 15A and 15B are diagrams each exemplarily showing output art-work data of wiring according to a conventional wiring method. As shown in the first conventional wiring method of FIG. 15A, based on its design rule, there are several conditions that a wiring pitch P=1.00 μm, a wiring width W=0.50 μm, the wiring minimum space S=0.50 μm, a side length of each via V=0.50 μm, and a via margin M=0.05 μm. The wiring space between portions of wiring, extending along grid lines which are parallel and adjacent to each other, is equal to 0.50 μm, i.e. (P−W)=0.50 μm. This satisfies above condition that the wiring minimum space S=0.50 μm. However, the space between a via cell and a portion of wiring respectively on adjacent and parallel grid lines is equal to 0.45 μm, i.e. (P−V−M)=0.45 μm, and the space between a via cell and another via cell respectively on adjacent and parallel grid lines is equal to 0.40 μm, i.e. (P−V−M−M)=0.40 μm. Both of the spaces do not fulfill the above condition that the wiring minimum space S=0.50 μm. Under the consideration of this, as illustrated in FIG. 15A, each via cell 23 needs to be arranged with a space of 1 pitch away from another portion of wiring 21 or another via cell 23. Hence, in this conventional wiring method, the occupied area A=15.00 μm². The larger the number of via cells, the larger the occupied area. A reference numeral 21 denotes an upper wiring layer, whereas a reference numeral 22 denotes a lower wiring layer.

In the second conventional wiring method of FIG. 15B, the wiring pitch P(V+M+M+S)=1.10 μm, so that the wiring space between via cells which are arranged respectively on adjacent and parallel grid lines is equal to or larger than the wiring minimum space S. According to this method, the occupied area A=10.89 μm². In such a structure, because the wiring pitch P=1.10 μm between target wiring layers over the entire LSI, if the number of via cells is small, the occupied area may increase as compared with the first conventional wiring method of FIG. 15A.

FIG. 16 is a flow diagram showing a process for replacing a via cell(s), according to the third conventional wiring method which is disclosed in Unexamined Japanese Patent Application KOKAI Publication No. H3-29343. The entire contents of this publication is herein incorporated by reference in its entirety. A process 160, for replacing a via cell, is carried out after the process 123 and before the process 124. In this third conventional wiring method, as shown in FIG. 17, a plurality of via cells 171 and 172 are prepared. Of the plurality of via cells 171 and 172 of various origins, a via cell with an adequate origin is selected, and any via cell(s) of an inappropriate origin is(are) replaced with the selected via cell.

As shown in FIG. 16, the process 160 includes steps 161, 162, 163, 164, 165 and 166. Data regarding laid out and wired electronic components is read out in the step 161. Information regarding the plurality of via cells of various origins is read out in the step 162. The wiring state of each portion of wiring, where a corresponding via cell is arranged, is identified in the step 163. The origin of each via cell is identified in the step 164. In the step 165, as shown in the third conventional wiring method of FIG. 17, a via cell of an adequate origin is selected. At the same time, each via is set small to the extent that the space between each via cell and a portion of wiring, along a grid line which is parallel and adjacent to a grid line of the via cell, and that the space between via cells are equal to or larger than the wiring minimum space S. In the step 166, any via cell(s) of an inadequate origin is replaced with the selected via cell.

After the step 160 is completely carried out, the via cells 171 and 172 of various origins are laid out as shown in FIG. 17. According to the third conventional wiring method, the wiring patterns, wherein the wiring pitch P=1.00 μm and the occupied area A=12.00 μm², can be realized. In the third conventional wiring method, the occupied area can surely be smaller than that of the first conventional wiring method. In addition, the third conventional wiring method is more effective than the second conventional wiring method, if a small number of via cells are used. However, in recent products of LSIs which are quite large in scale, millions of via cells are included. In this structure, more than ten hours of processing time is required for selecting a via cell of an adequate origin from the number of via cells of four or five various origins.

According to the conventional wiring methods, the allowable wiring space must be equal to or larger than the wiring minimum space S. However, recently, as long as the wiring space is equal to or smaller than a limit value of a predetermined wiring-facing length SL, the wiring space can be smaller than the wiring minimum value unless the wiring space is not further smaller than a short-run wiring space SS. This is called a short-run rule which is employed in the recent LSI manufacture. In the main automatic layout and wiring means 7 shown in FIG. 11, there is no function for wiring electronic components appropriately in consideration of the limit values of the wiring minimum space S and the short-run space SS. Further, the wiring has to be performed in consideration of only the wiring minimum space S which is larger than the short-run space SS as the limit value. Therefore, the occupied area is determined only according to the first, second, and third conventional wiring methods. Hence, while the wiring is performed by the automatic layout and wiring system, it is difficult to reduce the occupied area of the LSI chips because the effective use of the short-run rule is can not easily be realized.

SUMMARY OF THE INVENTION

It is accordingly an object of the present invention to provide a wiring method for use in an automatic layout and wiring system, which can effectively employ a short-run rule for performing a wiring process and can realize a decrease in an occupied area of LSI chips.

In order to achieve the above object, according to the first aspect of the present invention, there is provided a wiring method for use in an automatic layout and wiring system which automatically performs laying out and wiring of electronic components in a grid having a plurality of grid lines set at a predetermined wiring pitch, the method comprising:

detecting whether a wiring space, between a wiring layer pattern of a via cell and a wiring layer pattern along a grid line which is parallel and adjacent to a grid line of the via cell, is equal to or larger than a short-run wiring space, and creating, when detected that the wiring space is equal to or larger than the short-run wiring space, via cell data including a via margin which is set in such a way that a wiring space between the parallel grid lines of the via cell is equal to or larger than a wiring minimum space (which is long), the via cell being registered in a library and including a via with a square shape, an upper wiring layer and a lower wiring layer both covering the via and extending by the via margin in all directions; and performing laying out and wiring of the electronic components using the via cell data, and replacing the via cell data with art-work data corresponding to the via cell.

In the above method, there may be included a process for reading information including circuitry diagram information, a design rule, a cell/block library prior to the layout and wiring of the electronic components. This process may include a process for adapting a short-run rule. In the process for adapting a short-run rule, determination is made as to whether a wiring space between portions of via cells respectively along parallel and adjacent grids is equal to or larger than a short-run wiring space, when the length of the portions is within a limit value of a predetermined wiring-facing length. Further, in the process for adapting a short-run rule, there may be included a process for creating via-cell data, including a via margin which is so changed that the wiring space between the portions is equal to or larger than the wiring minimum space (which is large), based on the via cells. The process for adapting a short-run rule may include: a step of reading information including the limit value of a predetermined wiring-facing length suitable for the short-run rule and the allowable short-run wiring space; a step of determining that the short-run rule can be adapted when determined that the wiring space is equal to or larger than the short-run wiring space, and setting a via-margin changing flag indicating "change"; and a step of creating via cell data including a via margin which is so changed that the wiring space between the portions of wiring is equal to or larger than the wiring minimum space, based on the via cells, when the via-margin changing flag is set indicating "change" in the step of determining whether to adapt the short-run rule.

According to the second aspect of the present invention, there is provided a wiring method for use in an automatic layout and wiring system which automatically perform layout and wiring of electronic components in a grid having a plurality of grid lines set at a predetermined wiring pitch, the method comprising:

detecting whether a wiring space, between portions of wiring along grid lines respectively having via cells which are parallel and adjacent to each other, is equal to or larger than a short-run wiring space, and creating, when detected that the wiring space is equal to or larger than the short-run wiring space, via cell data including a via margin which is changed based on the via cells in such a way that the wiring space is equal to or larger than a wiring minimum space (long), each of the via cells being registered in a library and including a via with a square shape, an upper wiring layer and a lower wiring layer both covering the via and extending by the via margin in all directions; and performing layout and wiring of the electronic components using the via cell data, and replacing the via cell data with art-work data corresponding to the via cell.

In the above method, there may be included a process for reading circuitry diagram information and information including a design rule and a cell/block library before performing wiring of laid out cells/blocks. During this process, determination is made as to whether a wiring space, between a via cell and a portion of wiring along a grid line which is parallel and adjacent to a grid of the via cell, smaller than the wiring minimum space and is equal to or larger than a short-run wiring space, when the length of the portions is within a limit value of a predetermined wiring-facing length. Further, in the above process, there may be included a process for creating via-cell data including a via margin which is so changed that the wiring space is equal to or larger than the wiring minimum space, based on the via cell. The process for creating via-cell data may include: a step of reading information including a limit value of a predetermined wiring-facing length suitable for the short-run rule and an allowable short-run wiring space; a step of determining that the short-run rule can be adapted when determined that the wiring space between the via cell and the portion of wiring is smaller than the wiring minimum space and equal to or larger than the short-run wiring space, and setting a via-margin changing flag indicating "change"; and a step of creating via-cell data including a via margin which is so changed that the wiring space is equal to or larger than the wiring minimum space, based on the via cell, when the via-margin changing flag is set indicating "change".

According to the third aspect of the present invention, there is provided a computer readable recording medium which records a wiring method for use in an automatic layout and wiring system, the medium recording:

a first program for reading information including a limit value of a predetermined wiring-facing length suitable for a short-run rule and an allowable short-run wiring space;

a second program for determining whether the short-run rule can be adapted when detected that a wiring space, between portions of wiring along grid lines of via cells which are parallel and adjacent to each other, is equal to or larger than the short-run wiring space, and setting, when determined that the short-run rule can be adapted, a via-margin changing flag indicating "change";

a third program for creating via cell data including a via margin which is so changed that the wiring space is equal to or larger than a wiring minimum space based on the via cells, when determined that the via-margin changing flag is set indicating "change" by the second program;

a fourth program for performing wiring of arrayed blocks and cells using the via cell data;

a fifth program for replacing the via cell data into art-work data corresponding to the via cells, after completion of the wiring.

According to the fourth aspect of the present invention, there is provided a computer readable recording medium which records a wiring method for use in an automatic layout and wiring system, the medium recording:

a first program for reading information including a limit value of a predetermined wiring-facing length suitable for a short-run rule and an allowable short-run wiring space;

a second program for determining that the short-run rule can be adapted, when a wiring space between a via cell and a portion of wiring along a grid line which is parallel and adjacent to the via cell is smaller than a wiring minimum space (long) and equal to or larger than the short-run wiring space, and setting a via-margin changing flag indicating "change";

a third program for creating via cell data including a via margin, which is so changed that the wiring space between the via cell and the portion of wiring is equal to or larger than the wiring minimum space, based on the via cell, when determined that the via-margin changing flag is set indicating "change" by the second program;

a fourth program for performing wiring of laid out blocks and cells using the created via cell data; and a fifth program for replacing the via cell data with art-work data corresponding to the via cell after completion of the wiring.

According to the fifth aspect of the present invention, there is provided a layout and wiring system which automatically performs laying out and wiring of electronic components, comprising:

a detector which detects whether a space between a wiring pattern having a via cell and an adjacent wiring pattern is equal to or larger than a predetermined short-run wiring space;

a creator which creates, when detected that the space therebetween is equal to or larger than the predetermined short-run wiring space, via cell data including a via margin in such a way that a space between the via cell including the via margin and adjacent wiring is equal to or larger than a wiring minimum space; and a drawer which performs laying out and wiring of the electronic components using the via cell data.

According to the sixth aspect of the present invention, there is provided a system which automatically performs laying out and wiring of electronic components, comprising:

a detector which detects whether a space, between portions of wiring having via cells which are parallel and adjacent to each other, is equal to or larger than a short-run wiring space;

a creator which creates, when detected that the space therebetween is equal to or larger than the short-run wiring space, via cell data including a via margin which is changed based on the via cells in such a way that the wiring space is equal to or larger than a wiring minimum space; and a controller which performs laying out and wiring of the electronic components using the via cell data.

According to the seventh aspect of the present invention, there is provided an automatic layout and wiring system which automatically performs laying out and wiring of the electronic components in an grid having grid lines set at a predetermined wiring pitch, the system comprising:

a detector which detects that a space, between a via cell and a portion of wiring which is arranged along a grid line parallel and adjacent to a grid line of the via cell, is smaller than a wiring minimum space and equal to or larger than a short-run wiring space;

a creator which creates, when detected that the space therebetween is smaller than the wiring minimum space, via cell data including the via margin which is changed in such a way that the wiring space therebetween is equal to or larger than the wiring minimum space; and a controller which performs laying out and wiring of the electronic components with the via cell data, and replaces the via cell data with art-work data corresponding to the via cell.

According to the eighth aspect of the present invention, there is provided a method of automatically performing laying out and wiring of electronic components, comprising:

detecting whether a space between a wiring pattern having a via cell and an adjacent wiring pattern is equal to or larger than a predetermined short-run wiring space, and creating, when detected that the space therebetween is equal to or larger than the predetermined short-run wiring space, via cell data including a via margin in such a way that a spaced between the via cell including the via margin and adjacent wiring is equal to or larger than a wiring minimum space; and performing laying out and wiring of the electronic components using the via cell data.

According to the ninth aspect of the present invention, there is provided a method of automatically performing laying out and wiring of electronic components, comprising:

detecting whether a space, between portions of wiring having via cells which are parallel and adjacent to each other, is equal to or larger than a short-run wiring space, and creating, when detected that the space therebetween is equal to or larger than the short-run wiring space, via cell data including a via margin which is changed based on the via cells in such a way that the wiring space is equal to or larger than a wiring minimum space; and performing laying and out wiring of the electronic components using the via cell data.

According to the tenth aspect of the present invention, there is provided a method of automatically performing laying out and wiring of electronic components in a grid having grid lines set at a predetermined wiring pitch, comprising:

detecting whether a space, between a via cell and a portion of wiring which is arranged along a grid line parallel and adjacent to a grid line of the via cell, is smaller than a wiring minimum space and equal to or larger than a short-run wiring space, and creating via cell data including the via margin which is changed in such a way that the wiring space therebetween is equal to or larger than the wiring minimum space; and performing laying out and wiring of the electronic components with the via cell data, and replacing the via cell data with art-work data corresponding to the via cell.

BRIEF DESCRIPTION OF THE DRAWINGS

The object and other objects and advantages of the present invention will become more apparent upon reading of the following detailed description and the accompanying drawings in which:

FIG. 1 is a flow diagram for explaining a process for reading a library, which is carried out in a wiring method according to the first embodiment of the present invention;

FIG. 14A is a planer view of a via cell.

FIG. 15A is a diagram exemplifying a wiring layout which is designed according to the first conventional technique, and FIG. 15B is a diagram exemplifying a wiring layout which is designed according to the second conventional technique;

DETAILED DESCRIPTION OF THE PREFERRED EMBODIMENTS

Preferred embodiments of a layout and wiring system and wiring method of the present invention will now be explained with reference to the accompanying drawings. The hardware structure of the system is the same as the above-described conventional one. Thus, in this specification, only the characteristic operations of the system and processes of the wiring method will be described.

Figure 11:
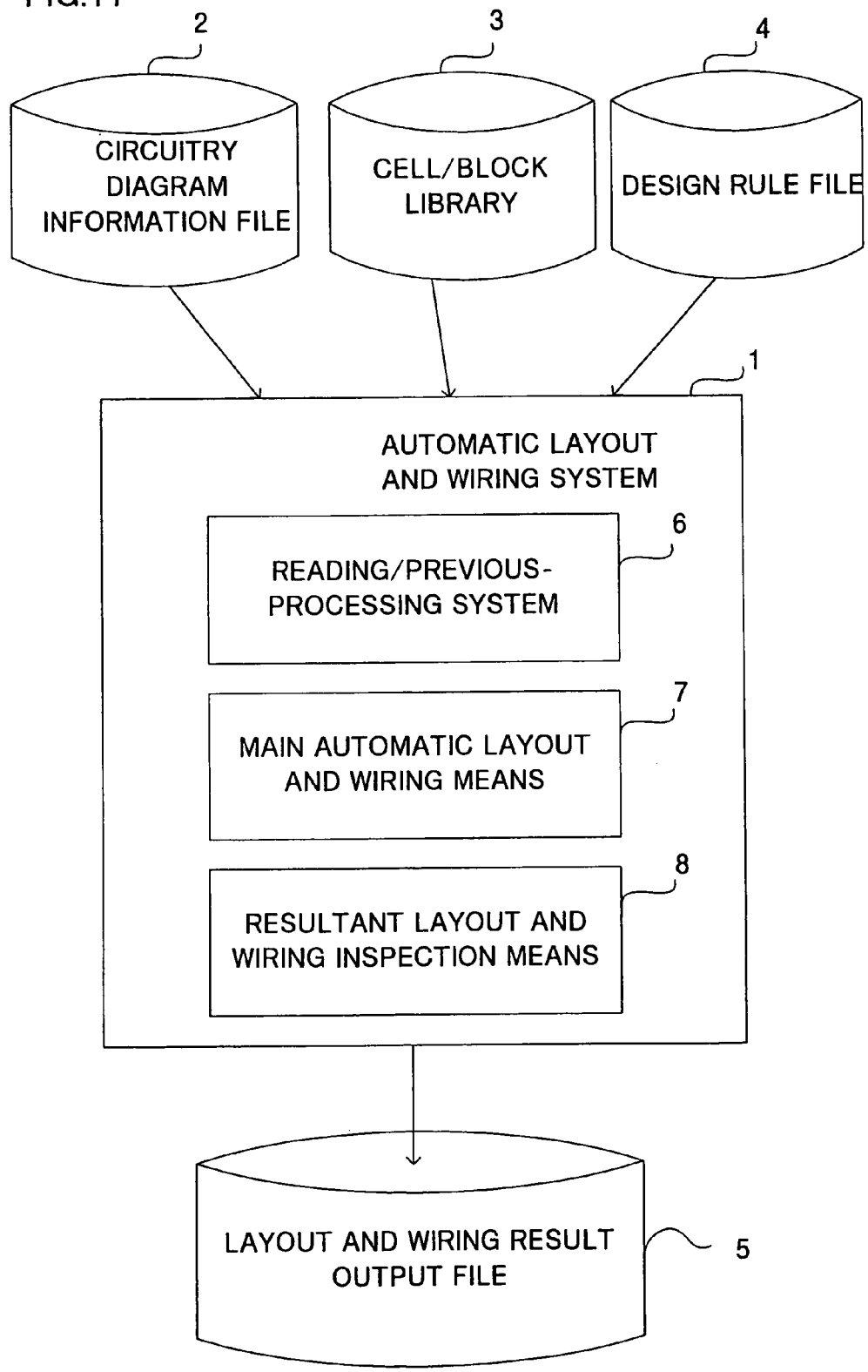
FIG. 11 is a diagram showing the structure of an automatic layout and wiring system.

FIG. 1 is a flow diagram for explaining a process for reading a library, which is carried out in a wiring method according to the first embodiment of the present invention. In embodiments of the present invention, the structure of an automatic layout and wiring system and the structures of input files and output file are the same those used in the conventional method of FIG. 11, except the reading/previous-processing means 6. The entire process for laying out and wiring electronic components is also the same as that explained in the conventional wiring technique of FIG. 12, except the process 121, for reading a library. Hence, the structure of the automatic layout and wiring system and the entire process for laying out and wiring electronic components will not be described in the following embodiments.

In FIG. 1, a process 121a for reading a library, includes a process 11 for reading circuitry diagram data, a process 12 for reading a design rule, a process 13 for adapting a short-run rule, and a process 14 for reading cell/block data. In this embodiment, the process 121a is employed in place of the process 121 of FIG. 12. More particularly, the process 121a includes a process 132 for reading a design rule, and a process 133 for reading cell/block data, which are included in a conventional process for reading a library shown in FIG. 13. A process 13 for adapting a short-run rule is performed after the process 132 and before the process 133. The process 11 shown in FIG. 1 is the same process as a conventional process 131 for reading circuitry diagram information, of FIG. 13. The process 12 is the same as the process 132. The process 14 is the same as the process 133.

The process 13, included in the process 121a includes a step 15 of reading a short-run rule, a step 16 of determining whether to adapt a short-run rule, and a step 17 of changing a via margin. The step 15 is prepared for reading information including both a limit value of a wiring-facing length suitable for a short-run rule and an allowable wiring space suitable for the short-run rule. The step 16 is prepared for determining whether to adapt a short-run rule, when a wiring space, between a wiring layer pattern of a via cell and a wiring layer pattern along a grid line parallel and adjacent to a grid line of the via cell, is equal to or larger than a wiring space of the short-run rule, so as to set a via-margin changing flag indicating "change". The step 17 is prepared for creating via cell data including a via margin which is so changed that the above wiring space is equal to or larger than the wiring minimum space, based on the data of the via cell, when the via-margin changing flag is set indicating "change" in the step 16.

Figure 2A:
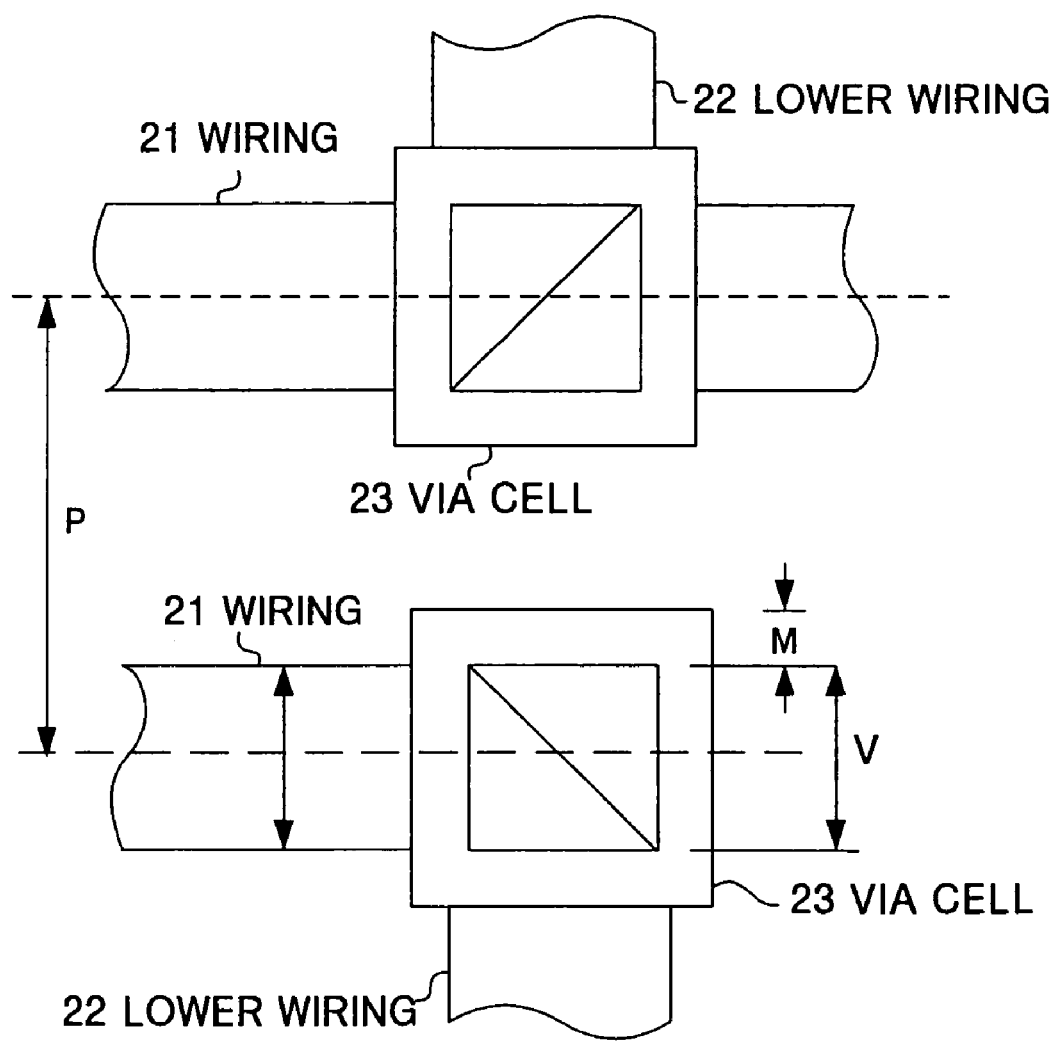
FIGS. 2A and 2B are diagrams each showing an example of a design rule for designing wiring and a via cell based on the wiring method according to the first embodiment.
Figure 2B:
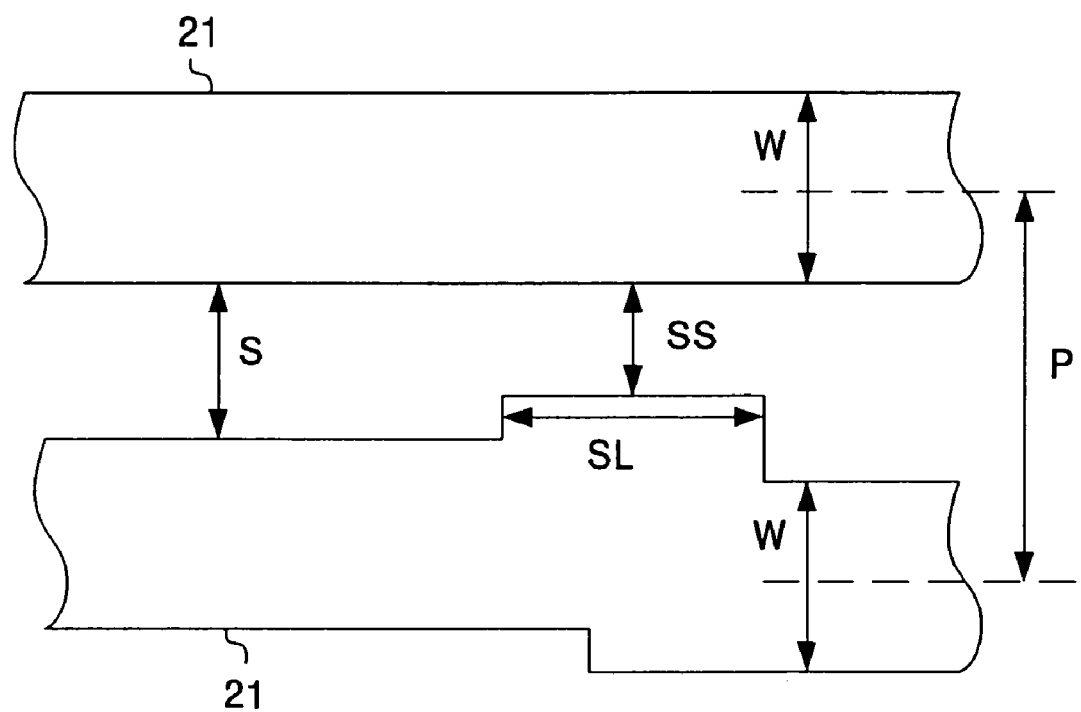

FIGS. 2A and 2B are diagrams each showing an example of a design rule, for portions of wiring and via cells, employed in the wiring method according to this embodiment. A via cell 23 is formed between a lower wiring layer 22 and an upper wiring layer 21, and has a lower wiring pattern and an upper wiring pattern, which cover a square-shaped via having a side length V and are extending by a via margin M in all directions. The upper wiring layer 21 and another wiring layer 21 in the same level of layer are arranged along grid lines which are parallel and adjacent to each other at a space of at least a wiring pitch P. Each portion of wiring 21 has a wiring width W which is a standard level for signal wiring. It is necessary that the portion of wiring 21 and the another portion of wiring 21 are separated by a space of equal to or larger than a wiring minimum space S. The wiring space may be set to a short-run wiring space SS to the minimum, as long as the wiring-facing length is equal to or smaller than a limit value of wiring-facing length according to the short-run rule. Hence, in general, $P \geq (W+S)$. However, it is allowable that $P \geq (W+SS)$, only if the wiring-facing length is equal to or smaller than the limit value of the wiring-facing length.

Explanations will now specifically be made to the step 15, the step 16, and the step 17. Such explanations will be made to an exemplary case where the limit value of wiring-facing length SL=1.00 μm, according to the short-run rule, and a short-run space SS=0.40 μm. Likewise the first, second and third conventional cases, a wiring pitch P=1.00 μm, a wiring width W=0.50 μm, a wiring minimum space S=0.50 μm, a side length of a via V=0.50 μm, and a via margin M=0.05 μm. In this structure, via cells can be arrayed respectively on adjacent grid lines in a manner the via cells are parallel and adjacent to each other.

Figure 3:
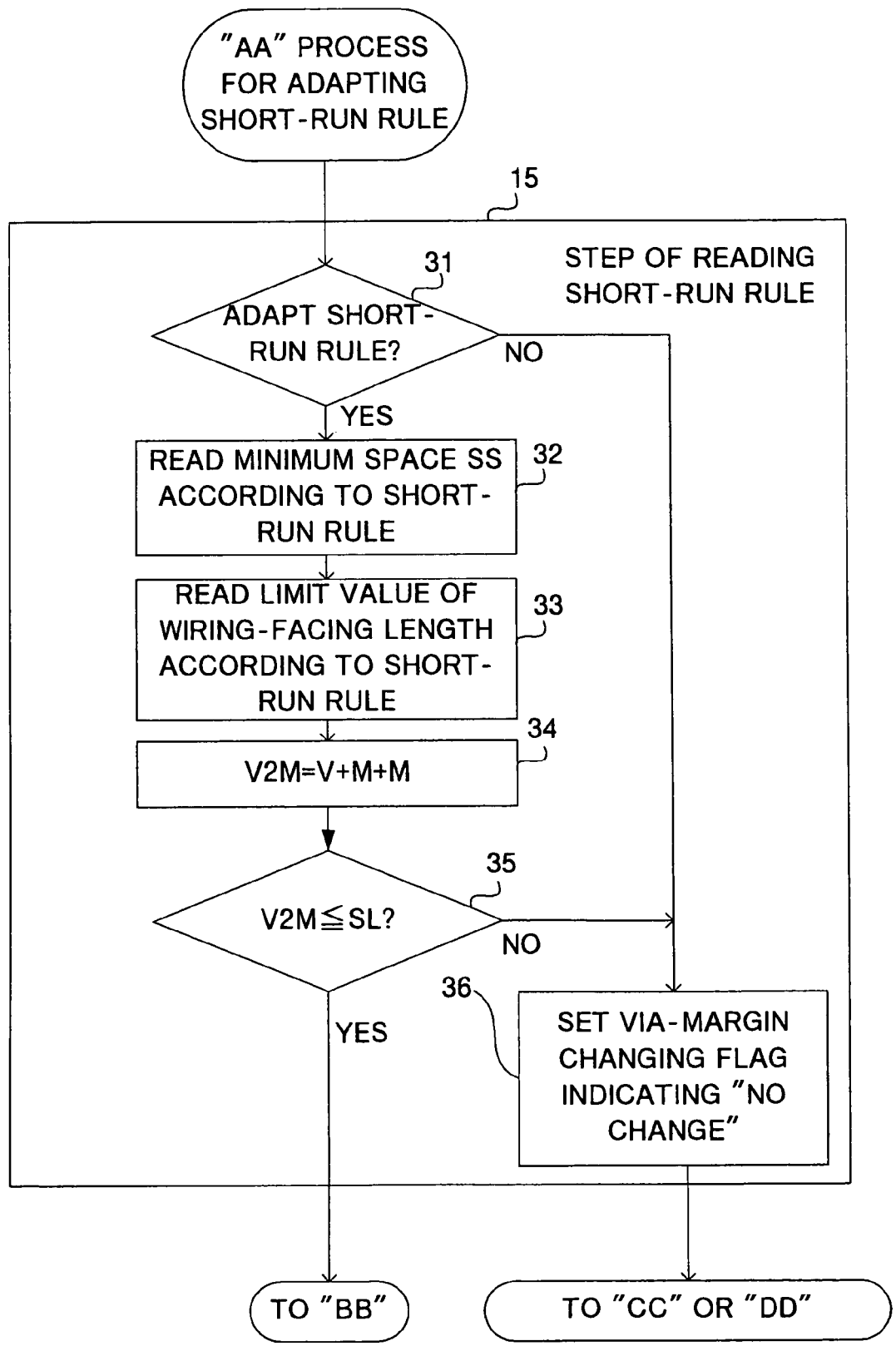
FIG. 3 is a flow diagram for specifically explaining a step of reading a short-run rule.

FIG. 3 is a flow diagram for specifically explaining the step 15 included in the process 13 of FIG. 1. The step 15 has a sub-step 31, wherein it is determined whether a short-run rule is to be adapted for automatic layout and wiring.

When determined that the short-run rule is to be adapted in the sub-step 31, the flow advances to a sub-step 32, wherein a short-run wiring space SS according to the short-run rule is read out. Then, the flow advances to a sub-step 33, wherein a limit value of wiring-facing length SL according to the short-run rule is read out.

In the next sub-step 34, a via-cell width V2M is obtained by adding two times a via margin M to a side length V of a via. That is, V2M=(V+M+M) is calculated. In the new sub-step 35, it is determined whether the via-cell width V2M is equal to or smaller than the limit value of wiring-facing length SL, i.e., whether the inequality of V2M≦SL can be satisfied. When determined that V2M≦SL, the step 15 is completed, and the flow advances to the step 16.

When determined that the short-run rule is not to be adapted in the sub-step 31, or when determined that the inequity of V2M≦SL is not satisfied, the flow advances to a sub-step 36. In the sub-step 36, a via-margin changing flag is set indicating a "no-change". Then, the step 15 is completed, and the flow advances to the step 17.

In this embodiment, in a sub-step 34, the via-cell width V2M=0.50+0.50+0.50=0.60 μm, and the limit value of wiring-facing length SL=1.00 μm. In this condition, the inequality of V2M≦SL is satisfied, and the flow advances to the step 16.

In the sub-step 31, an instruction of whether the short-run rule is to be set valid or non-valid may be registered in a library in advance, or the instruction may externally be performed during the activation of the automatic layout and wiring system. In the case where the design rule is so set as to satisfy the inequality of V2M≦SL, the sub-steps 33, 34 and 35 may be excluded from the step 15.

Figure 4:
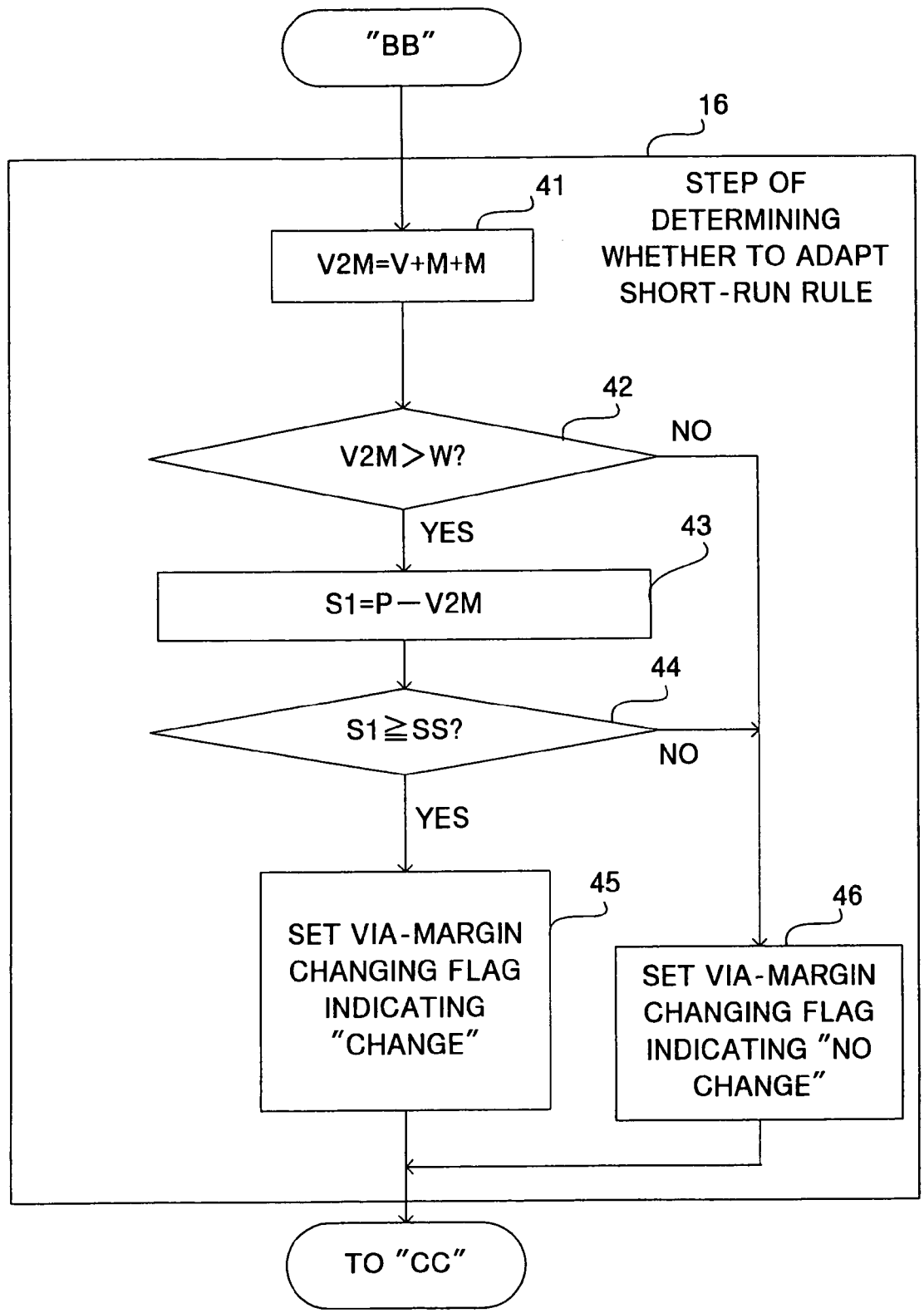
FIG. 4 is a flow diagram for specifically explaining a step of determining whether to adapt the short-run rule.

FIG. 4 is a flow diagram for specifically explaining the step 16. In a sub-step 41, the via-cell width V2M is obtained by adding two times the via margin to the side length. If the via-cell width V2M has already been obtained in the sub-step 34 of the step 15, the sub-step 41 may be omitted.

Then, the flow advances to a sub-step 42, wherein it is determined whether the via-cell width V2M is larger than a standard wiring width W for signal wiring, i.e. it is determined whether the inequality of V2M>W is satisfied. When determined that the inequality of V2M>W is satisfied in the sub-step 42, the flow advances to a sub-step 43. In the sub-step 43, the via-cell width V2M is subtracted from the wiring pitch P so as to obtain a logical minimum space S1, i.e. the calculation of S1=(P−V2M) is performed.

Then, the flow advances to a sub-step 44, wherein it is determined whether the logical minimum space S1 is equal to or larger than the short-run wiring space SS, i.e. whether the inequality of S1≧SS is satisfied. When determined that S1≧SS, the flow advances to a sub-step 45. In the sub-step 45, the via-margin changing flag is set indicating "change". The step 16 is completed, and the flow advances to the step 17.

When determined that the inequality of V2M>W is not satisfied in the sub-step 42, when determined the inequality of S1≧SS is not satisfied in the sub-step 44, the flow advances to a sub-step 46. In the sub-step 46, the via-margin changing flag is set indicating "non-change". Then, the step 16 is completed, and the flow advances to the step 17.

In this embodiment, the via-cell width V2M=0.60 μm is obtained in the sub-step 41. In addition, in the sub-step 42, if it is determined that V2M>W, the flow advances to the sub-step 43. In the sub-step 43, the logical minimum space S1=(1.00−0.60)=0.40 μm is obtained. Since S1=SS=0.4 μm, in the sub-step 44, it is determined that S1≧SS. In the sub-step 45, the via margin changing flag is set indicating "change", and the flow advances to the step 17.

Figure 5:
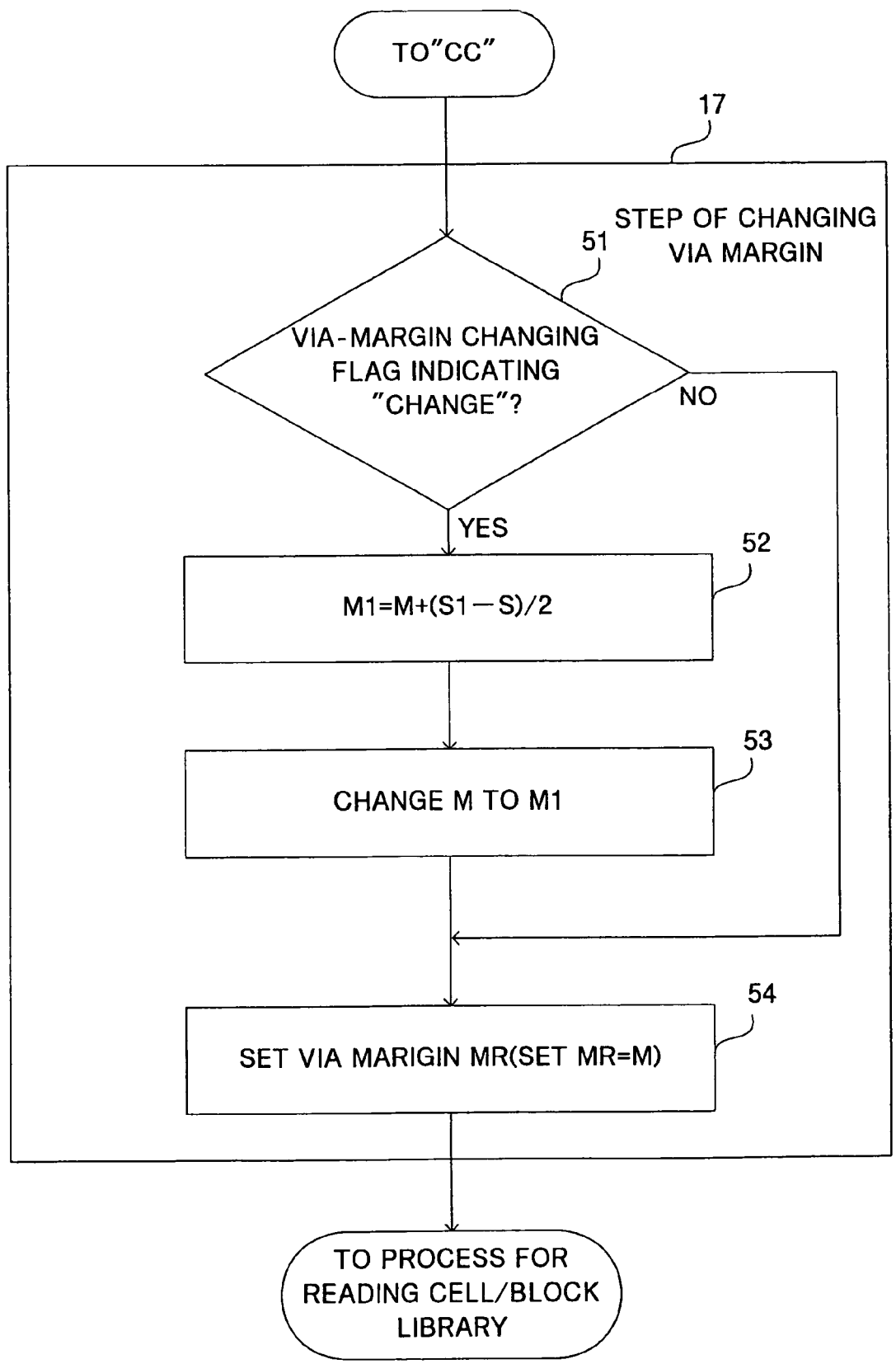
FIG. 5 is a flow diagram for specifically explaining a step of changing a via margin.

FIG. 5 is a flow diagram for specifically explaining the step 17. In a sub-step 51, it is determined that the via-margin changing flag is set indicating "change". When determined that the via-margin changing flag is set indicating "change", the flow advance to a sub-step 52. In the sub-step 52, the wiring minimum space S is subtracted from the logical minimum space S1, which is obtained in the sub-step 43 of the step 16, and a resultant subtraction is divided by 2. The via margin M is added to the remainder of the division so as to obtain a virtual margin M1. That is, the virtual margin M1 is obtained by the calculation of M1=M(S1−S)/2. Then, the flow advances to a sub-step 53, wherein the via margin M is changed to the virtual margin M1.

When determined that the via-margin changing flag is not set indicating "change" in the sub-step 51, or if the flow advance to a sub-step 54 after carrying out the sub-step 53, a wiring margin MR for use in automatic layout and wiring is set, and via cell data is created, thus completing the step 17. When determined that the via-margin changing flag is set indicating "change" in the sub-step 51, the wiring margin MR of the via cell data is equal to the virtual via margin M1 which is obtained in the sub-step 52. On the contrary, when determined that the via-margin changing flag is not set indicating "change" in the sub-step 51, the wiring margin MR of the data is equal to the via margin M in accordance with the design rule.

In this embodiment, if it is determined that the via-margin changing flag is set indicating "change" in the sub-step 51, the virtual margin M1=(0.05+(0.40−0.50)/2)=0 μm is calculated in the sub-step 52. Then, the via margin of the via cell data is set as MR=0 μm.

After the completion of the step 17, the flow advance to the process 14, for reading cell/block information, as shown in FIG. 1. Likewise a conventional process 133, for reading cell/block data, shown in FIG. 13, an art-work cell name indicating art-work data for the part of a via is read out so as to add the read name to the via cell data. The via margin of the art-work data itself is M (in this embodiment, M=0.05 μm).

Figure 12:
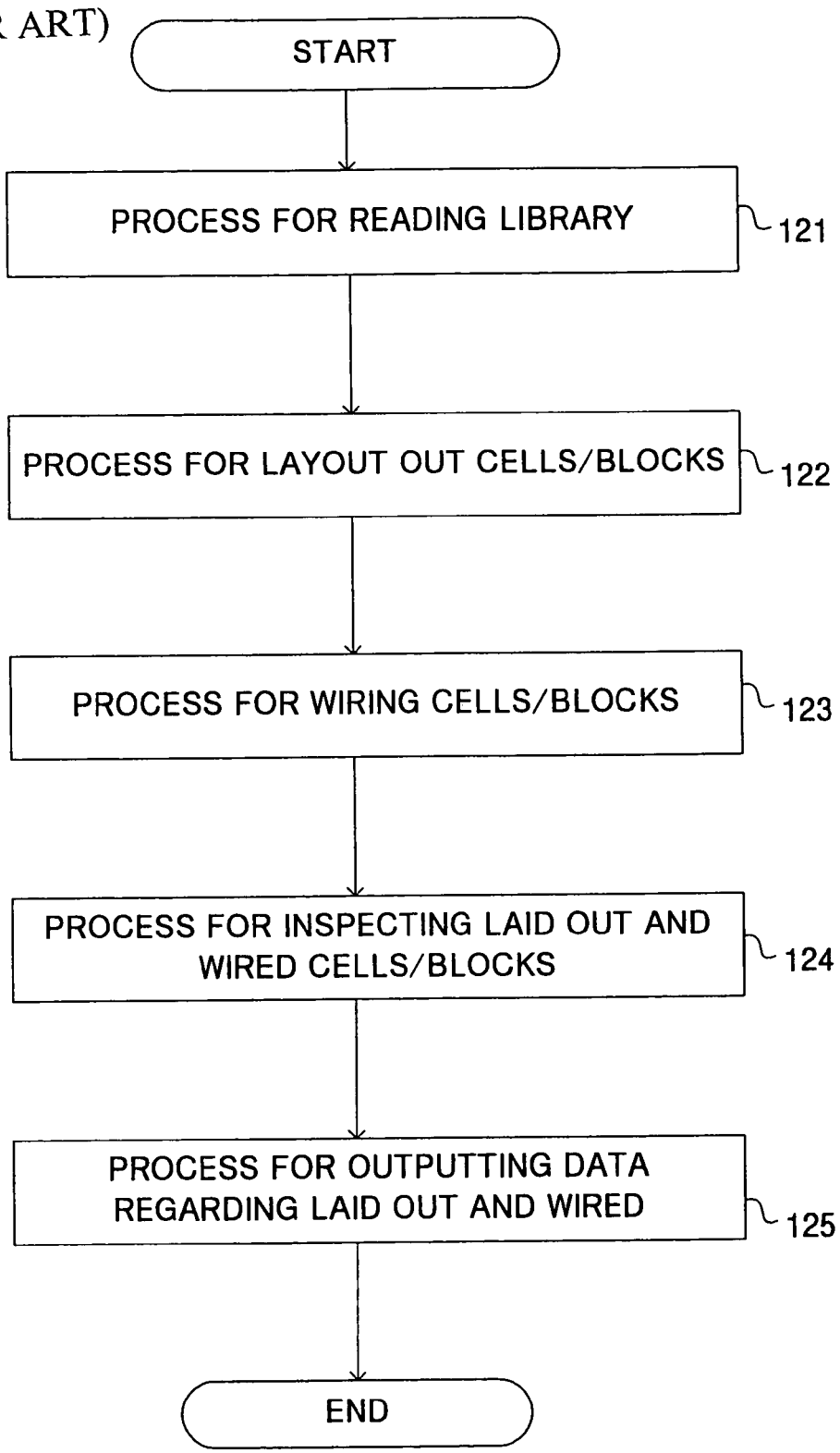
FIG. 12 is a flow diagram for explaining a layout and wiring process.
Figure 13:
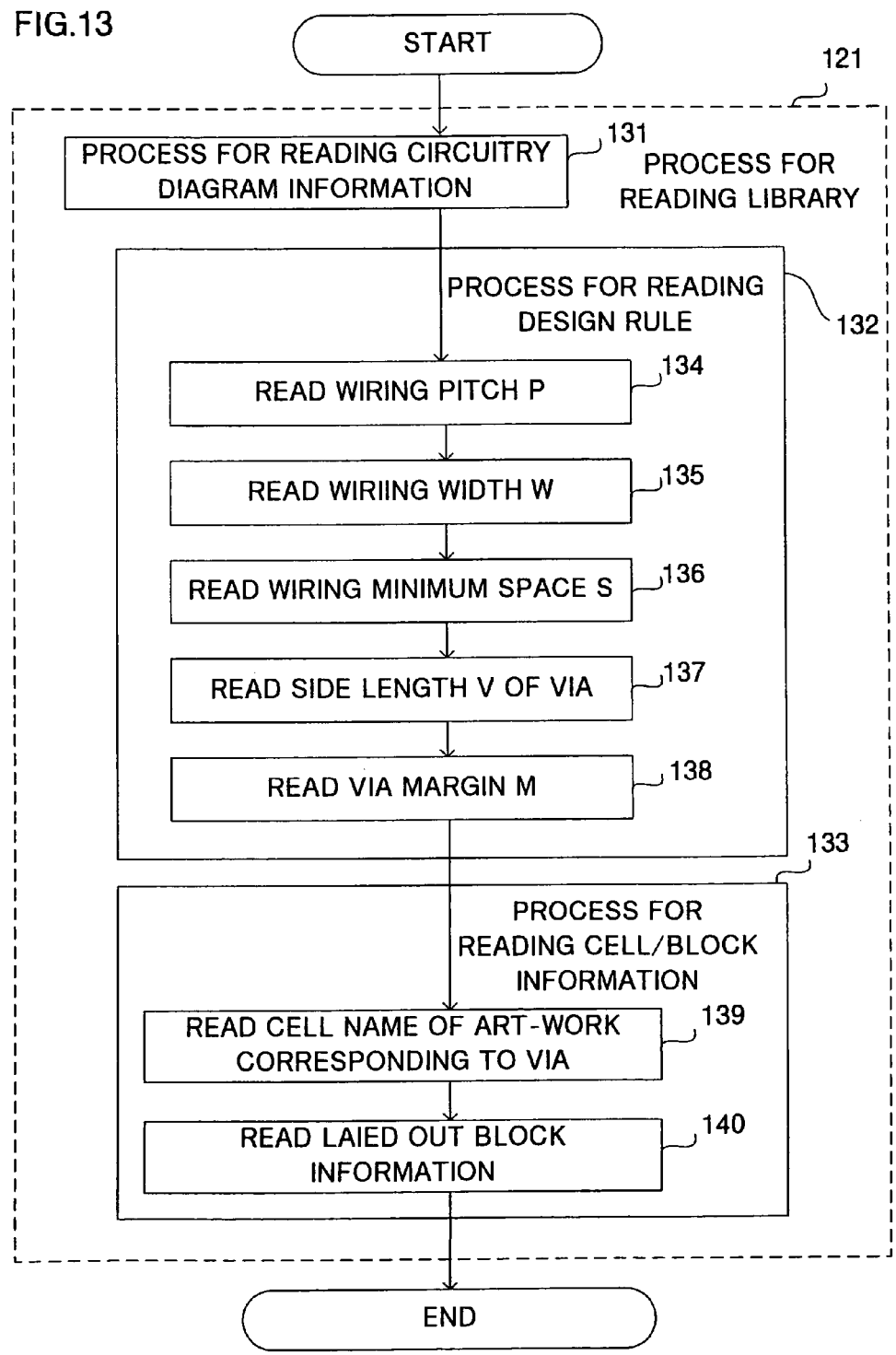
FIG. 13 is a flow diagram for specifically explaining a conventional process for reading a library.
Figure 14B:
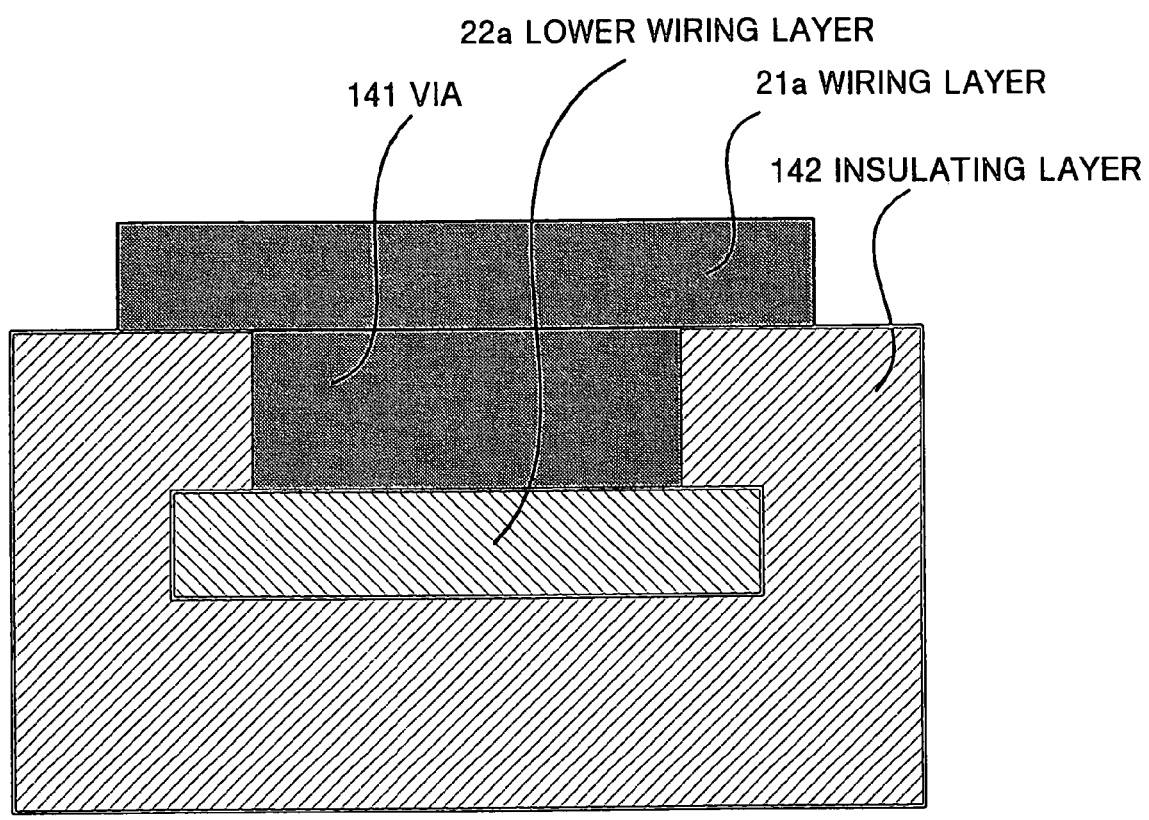
FIG. 14B is a cross sectional view of the via cell which is mounted into a LSI.
Figure 16:
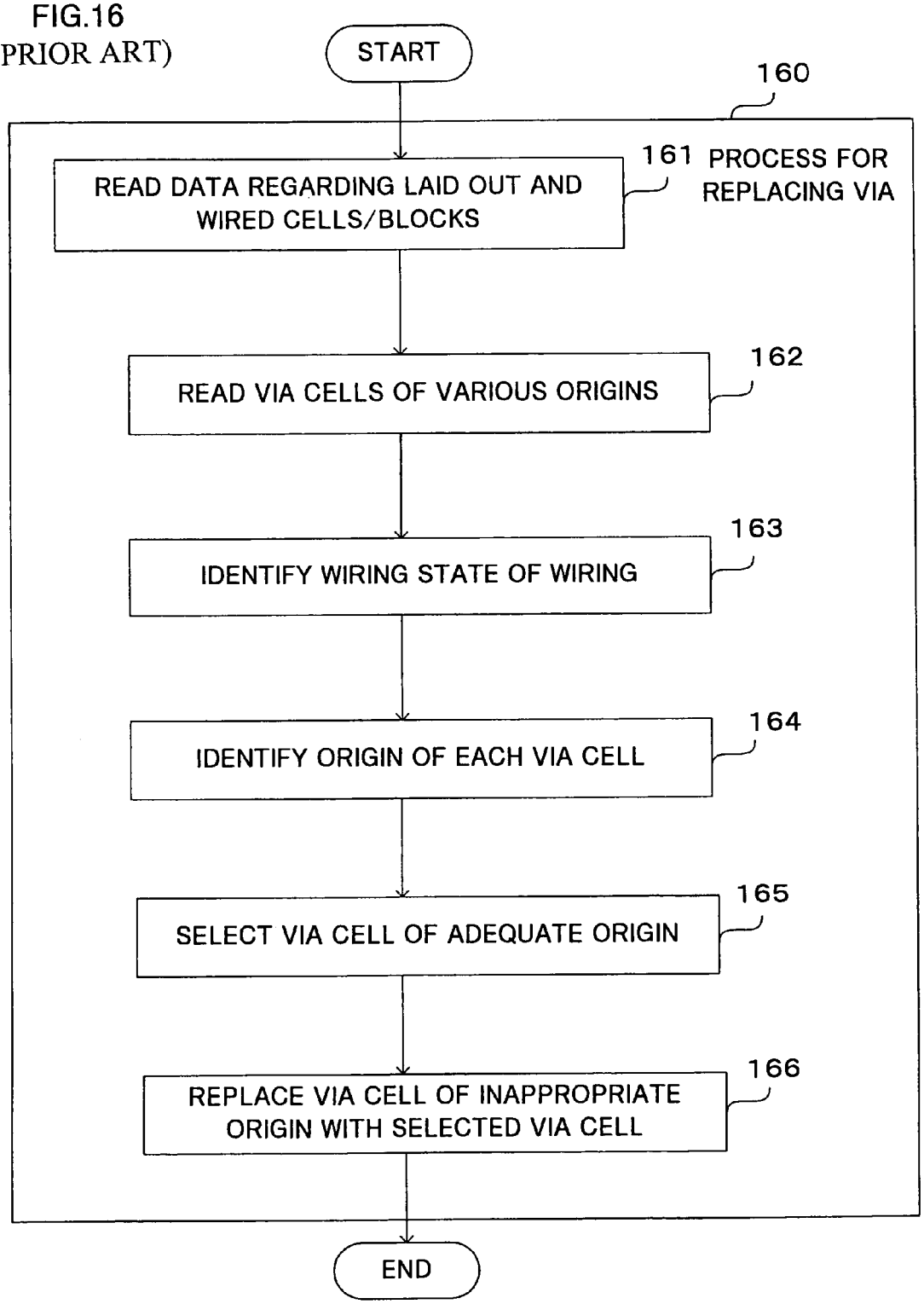
FIG. 16 is a flow diagram for explaining a process for replacing a via cell, which is carried out in a wiring method according to the third conventional technique.
Figure 17:
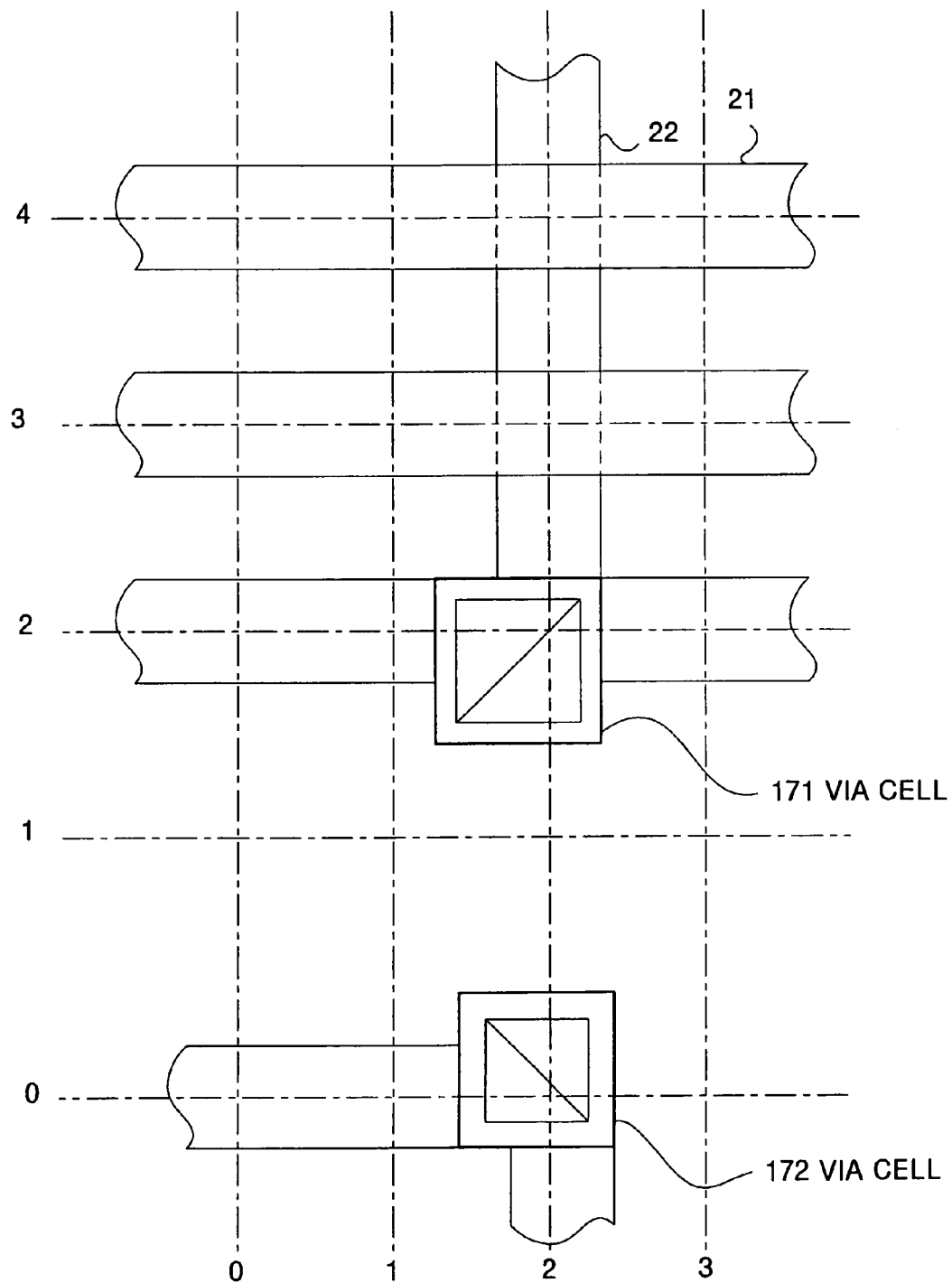
FIG. 17 is a diagram exemplifying a wiring layout which is designed according to the third conventional technique.

With the adaptation of the wiring method according to this embodiment, when carrying out a process 123 for wiring cells/blocks with an automatic layout and wiring system 1 of FIG. 12, via cell data, including the changed via margin MR (in this embodiment, MR=0.05 μm) as a via margin, is used. Hence, as exemplarily shown in resultant wiring of FIG. 6, the wiring minimum space S is satisfied at any point where a portion of wiring is adjacent and parallel to another portion of wiring and where via cells face each other. Therefore, no defect should be detected in a process 124, for inspecting layout and wiring of electronic components.

Figure 6:
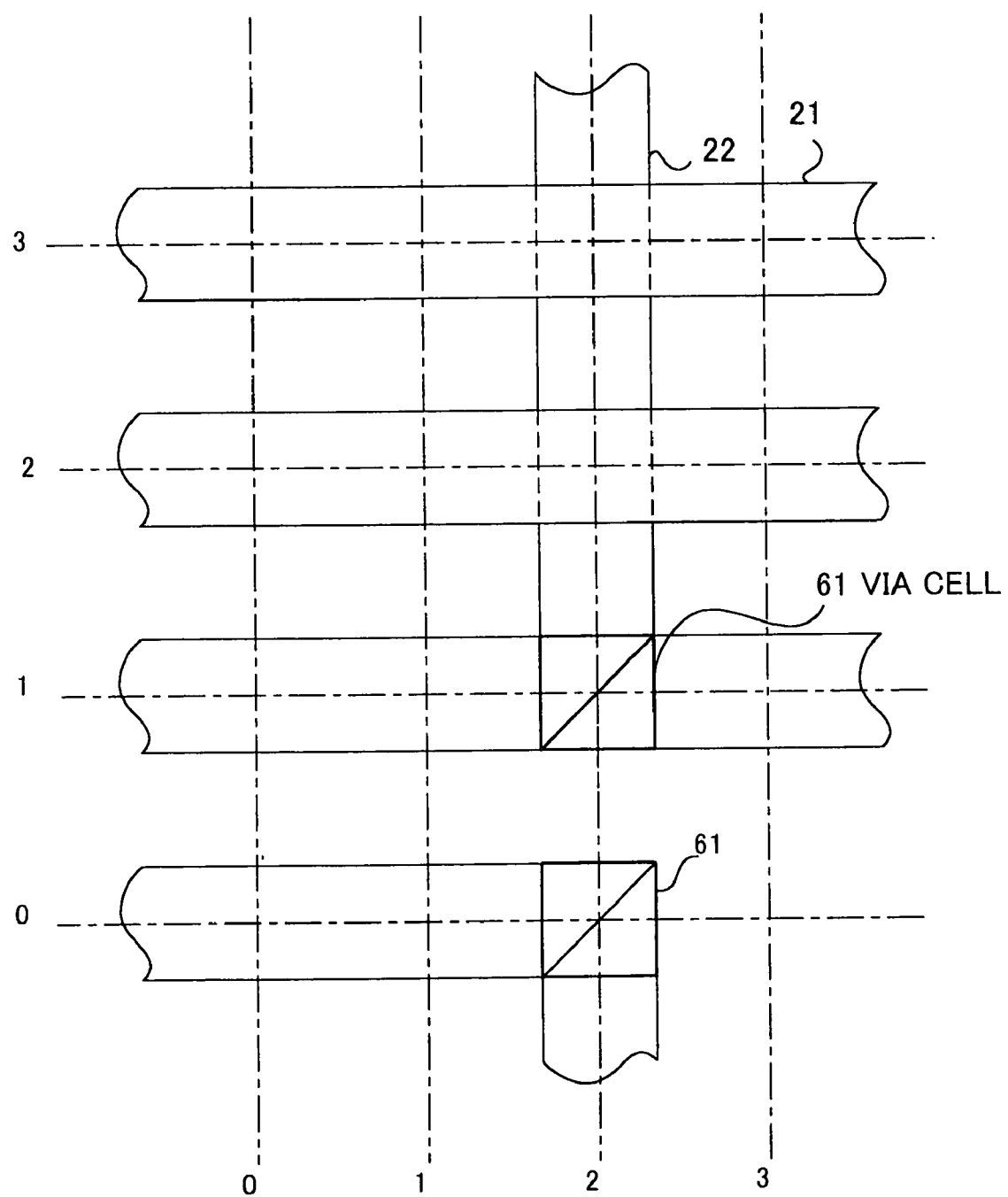
FIG. 6 is a diagram exemplarily showing a resultant wiring layout.
Figure 7:
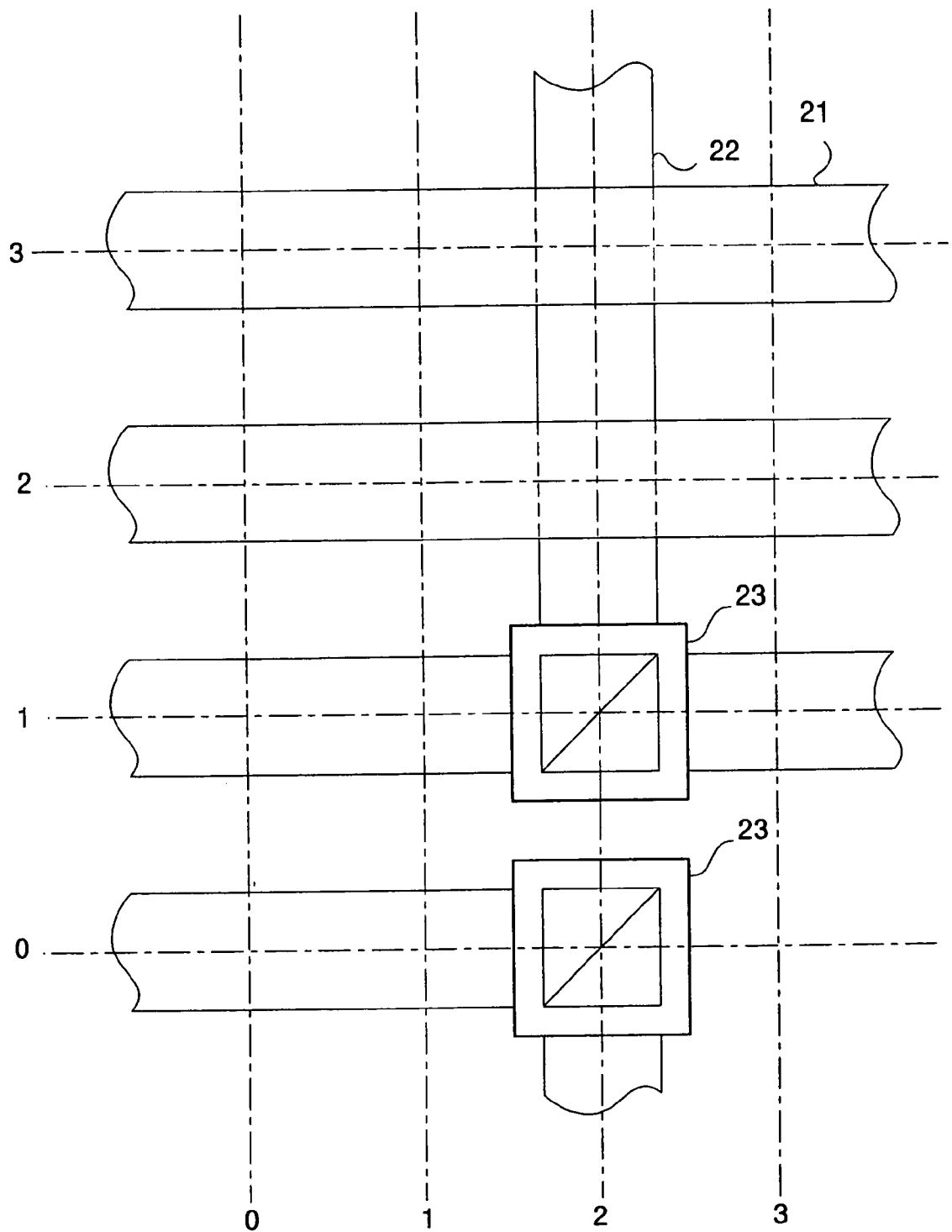
FIG. 7 is a diagram exemplifying a wiring layout which is designed based on the wiring method according to the first embodiment.

In a process 125, for outputting resultant layout and wiring data, an art-work cell name of a via cell corresponding to via cell data of resultant wiring is detected, and art-work data corresponding to the detected art-work cell name is output. By doing so, a via cell 61, whose via margin is 0 μm, shown in FIG. 6 is output in place of the original via cell 23, whose via margin is 0.05 μm. FIG. 7 is a diagram exemplarily showing a wiring layout which is designed based on the wiring method of this embodiment. A plurality of via cells 23 face each other in a grid whose wiring pitch of 1.00 μm. The space between the wiring layers of via cells is set in accordance with the short-run rule, as performed in the process 13. According to the short-run rule, as shown in FIG. 7, an occupied area of the wiring A=9.00 μm². The occupied area according to the short-run rule is smaller than any of the first, second and third conventional cases.

In FIGS. 3, 4, and 5, in the automatic layout and wiring system which allows via cells to face each other, it is determined whether the short-run rule can be adapted in any place where via cells face each other at the smallest space in the wiring. In the case where the short-run rule can be adapted in the place, the via margin is changed in such a way that a wiring space between the via cells is equal to or larger than the wiring minimum space. When the wiring is automatically performed in accordance with the design rule for setting a large via margin, in order to avoid an increase in the wiring pitch in the above place, it is common to employ an automatic layout and wiring system. This system allows a portion of wiring to be parallel and adjacent to another portion of wiring or a via cell, and prohibits via cells being parallel and adjacent to each other. Explanations will now be made to a wiring method, according to the second embodiment of the present invention, which can effectively adapt the short-run rule into such an automatic layout and wiring system.

In the second embodiment of the present invention, the step 16 and the step 17 which are included in the process 13 differ from those of the first embodiment. The explanation of the step, of reading the short-run rule, common between the first and second embodiments will not be made in the second embodiment. Hence, only those steps which are different from those of the first embodiment will be described in the second embodiment.

Figure 8:
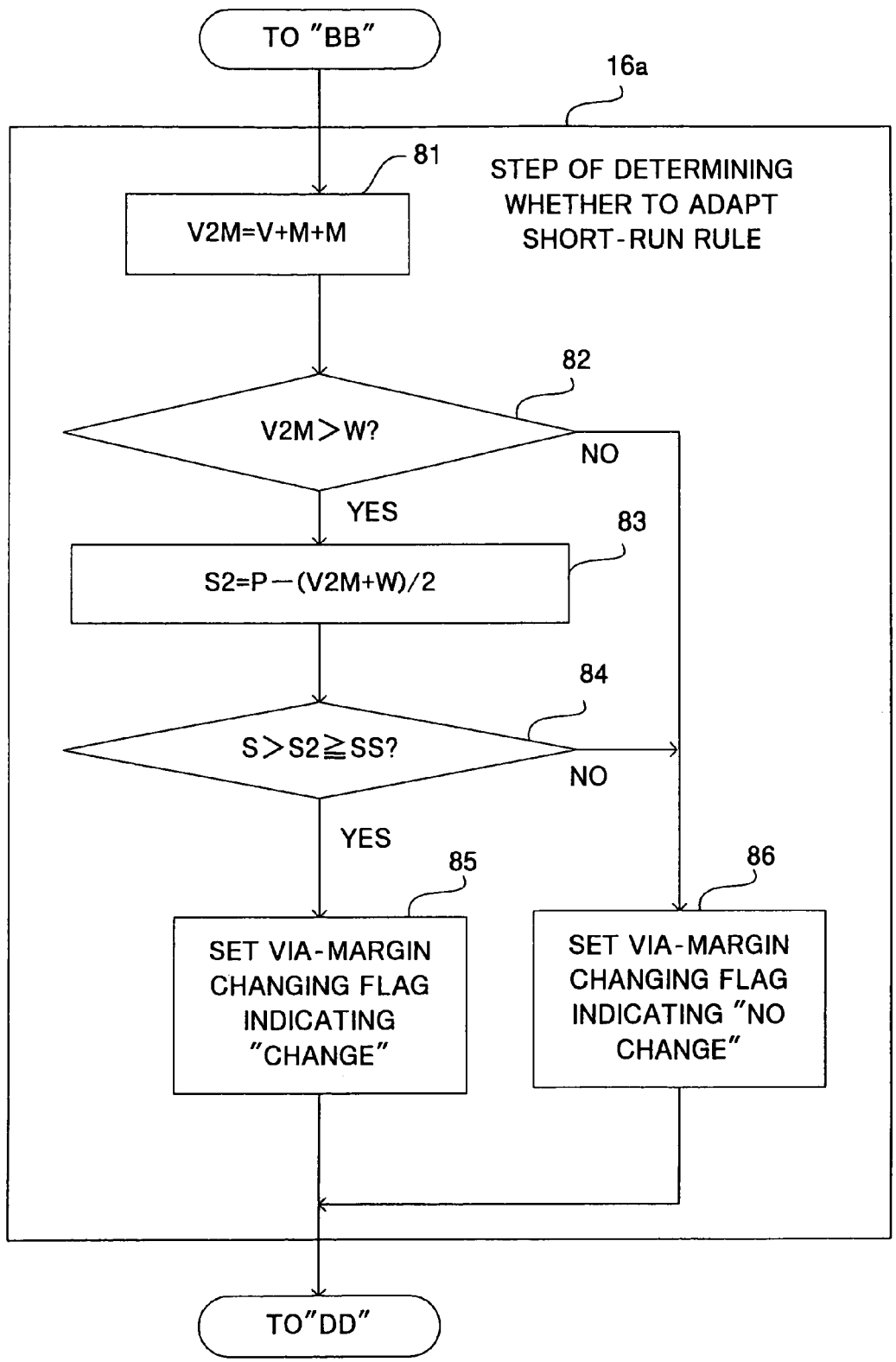
FIG. 8 is a flow diagram for specifically explaining a step of determining whether to adapt a short-run rule, which is carried in a wiring method according to the second embodiment of this embodiment.

FIG. 8 is a flow diagram for specifically explaining a step 16a, of determining whether to adapt the short-run rule. In a sub-step 81, a via-cell width V2M is obtained by adding two times the via margin M to a side length of via V. If the via-cell width V2M has already been obtained in the sub-step 34 of the step 15, the sub-step 81 may be omitted likewise the step 41 of FIG. 4.

In the next sub-step 82, it is determined whether via-cell width V2M is larger than a standard width W of signal wiring, or whether the inequality of V2M>W is satisfied. When determined that the inequality of V2M>W is satisfied in the sub-step 82, the flow advances to a sub-step 83. In the sub-step 83, the via-cell width V2M is added to the wiring width W. The sum of the addition is divided by 2. The quotient of the division is subtracted from the wiring pitch P so as to obtain a logical minimum space S2, i.e. the calculation of S2=(P−(V2M+W)/2) is completed.

In the next sub-step 84, it is determined whether the logical minimum space S2 is in a range from the short-run wiring space SS to less than the wiring minimum space S, i.e. whether the inequality of S>S2≧SS is satisfied. In the case where the inequality of S>S2≧SS is satisfied, the flow advances to a sub-step 84. In the sub-step 84, the via-margin changing flag is set indicating "change". Thus, the step 16a is completed, and the flow advances to a step 17a, of changing the via-margin.

If it is determined that the inequality of V2M>W is not satisfied in the sub-step 82, or that the inequality of S>S2≧SS is not satisfied, the flow advances to a sub-step 86. In the sub-step 86, the via-margin changing flag is set indicating "no-change". Then, the step 16a is completed, and the flow advances to the step 17a.

Figure 9:
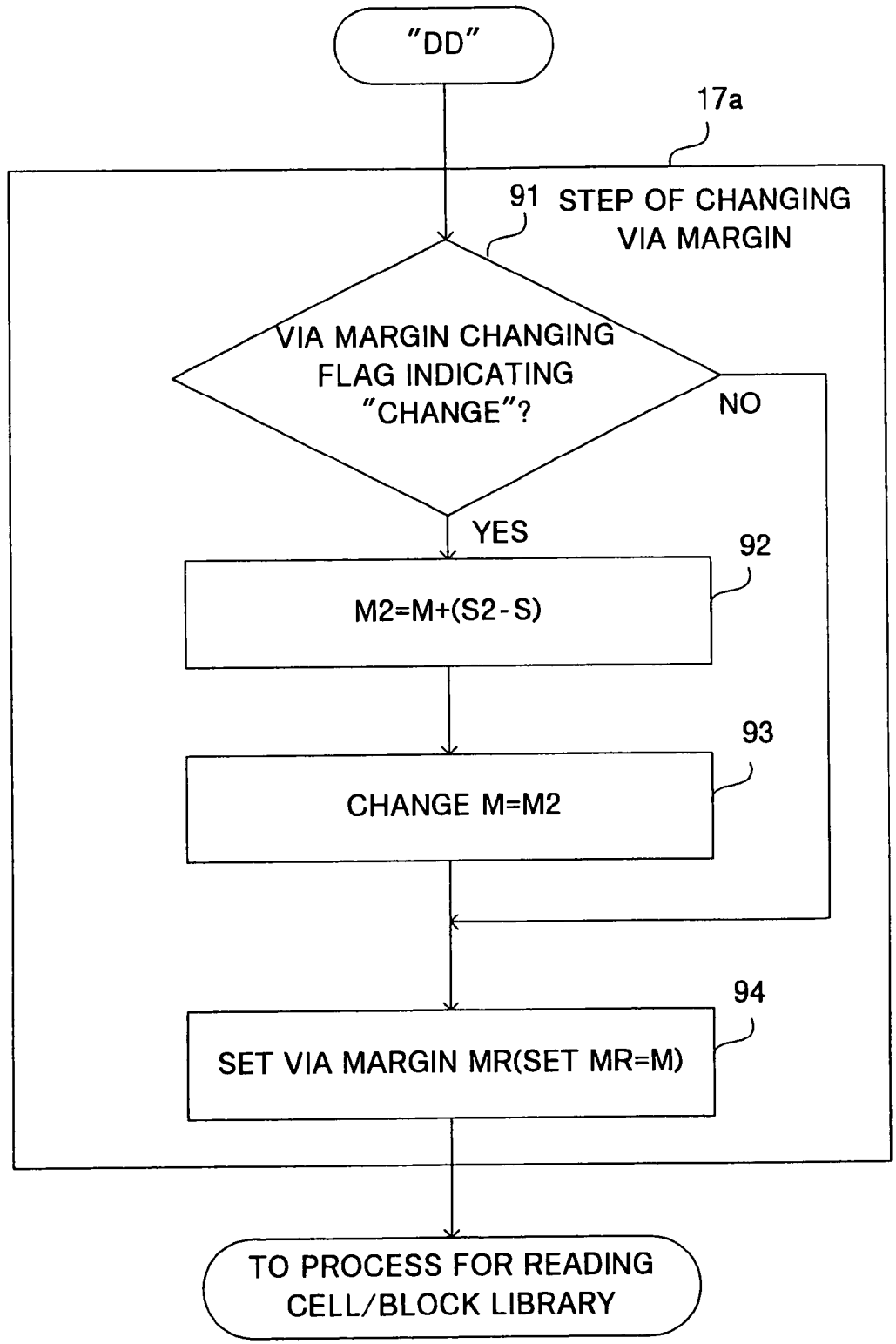
FIG. 9 is a flow diagram for specifically explaining a step of changing a via margin, which is carried out in the wiring method according to the second embodiment.

FIG. 9 is a flow diagram for specifically explaining the step 17a. In a sub-step 91, it is determined whether the via-margin changing flag is set indicating "change". When determined that the via-margin changing flag is set indicating "change", the flow advances to a sub-step 92. In the sub-step 92, a virtual margin M2 is calculated, i.e. calculation of M2=M+(S2−S) is performed. This calculation is performed by subtracting the wiring minimum space S from the logical minimum space S2 obtained in the sub-step 83 of the step 16a. Further, the via margin M is added to the remainder of the subtraction. Then, the flow advances to a sub-step 93, wherein the via margin M is changed to the virtual margin M2.

When determined that the via-margin changing flag is not set indicating "change" in the sub-step 91, or after carrying out the sub-step 93, the flow advances to a sub-step 94. In the sub-step 94, a wiring via margin MR for use in automatic layout and wiring is set, and via cell data is created. Then, the step 17a is completed. When determined that the via-margin changing flag is set indicating "change" in the sub-step 91, the margin MR of the via cell data will be equal to the virtual via margin M2 calculated in the sub-step 92. On the contrary, when determined that the via-margin changing flag is not set indicating "change" in the sub-step 91, the wiring margin MR of the via cell data is equal to the via margin M according to the set design rule.

Figure 10:
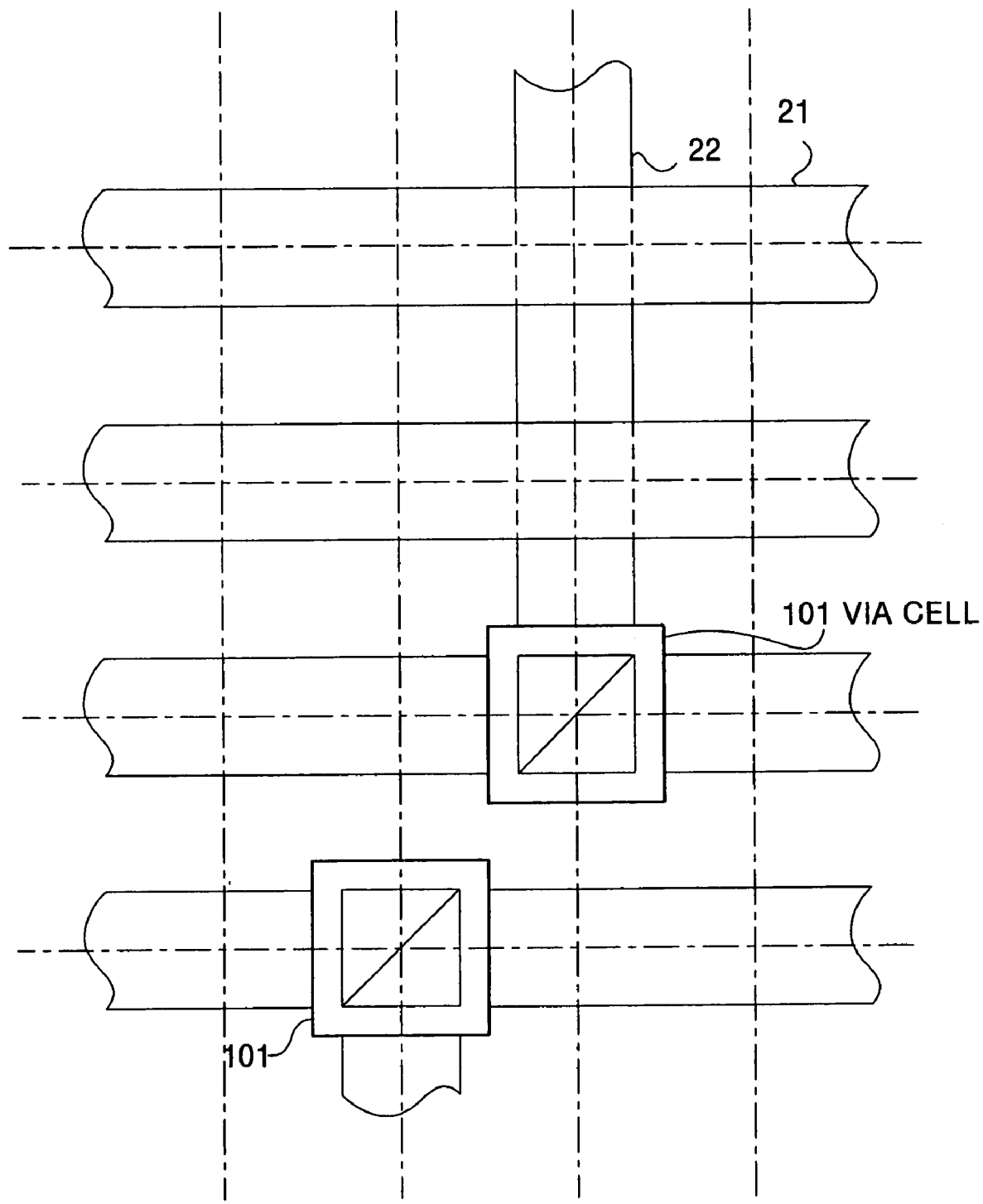
FIG. 10 is a diagram exemplifying a wiring layout which is designed based on the wiring method according to the second embodiment.

The following steps of wiring and outputting wiring data are the same as those of the first embodiment. FIG. 10 is a diagram exemplarily showing a wiring layout which is designed in accordance with the wiring method according to the second embodiment. There is a space of at least the short-run space SS between a via cell 101, with a large via margin, and a portion of wiring 21.

In the sub-step 84 which is included in the step 16a of FIG. 8, the determination may simply be made as to whether the inequality of S2≧SS is satisfied likewise the sub-step 44 of the step 14 shown in FIG. 4. Likely to the above, the determination in the sub-step 44 shown in FIG. 4 may be made as to whether the inequality of S>S2≧SS is satisfied likewise the sub-step 84 of FIG. 8.

In the sub-step 53 included in the step 17 of FIG. 5, the via margin M is changed to the virtual via margin M1. Even if the via margin M is set to an arbitrary value within a range of 0<M<M1, the effect of the present invention can practically be realized. Similarly, in the sub-step 93, even if the via margin M is set to an arbitrary value within a range of 0<M<M2, the effect of the present invention can practically be realized.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H1 1-363393 filed on Dec. 21, 1999, and including specification, claims, drawings and summary. The disclosure of the above Japanese Patent Application is incorporated herein by reference in its entirety.

What is claimed is:

1. A layout and wiring system which automatically performs laying out and wiring of electronic components, comprising:

a detector which detects whether a space between a wiring pattern having a via cell and an adjacent wiring pattern is equal to or larger than a predetermined short-run wiring space;

a creator which creates, when detected that the space therebetween is equal to or larger than the predetermined short-run wiring space, via cell data including a via margin in such a way that a space between the via cell including the via margin and adjacent wiring is equal to or larger than a wiring minimum space; and a controller which performs laying out and wiring of the electronic components using the via cell data.

2. A system which automatically performs laying out and wiring of electronic components, comprising:

a detector which detects whether a space, between portions of wiring having via cells which are parallel and adjacent to each other, is equal to or larger than a short-run wiring space;

a creator which creates, when detected that the space therebetween is equal to or larger than the short-run wiring space, via cell data including a via margin which is changed based on the via cells in such a way that the wiring space is equal to or larger than a wiring minimum space; and a controller which performs laying out and wiring of the electronic components using the via cell data.

3. An automatic layout and wiring system which automatically performs laying out and wiring of the electronic components in an grid having grid lines set at a predetermined wiring pitch, said system comprising:
- a detector which detects that a space, between a via cell and a portion of wiring which is arranged along a grid line parallel and adjacent to a grid line of the via cell, is smaller than a wiring minimum space and equal to or larger than a short-run wiring space;
- a creator which creates, when detected that the space therebetween is smaller than the wiring minimum space, via cell data including the via margin which is changed in such a way that the wiring space therebetween is equal to or larger than the wiring minimum space; and
- a controller which performs laying out and wiring of the electronic components with the via cell data, and replaces the via cell data with art-work data corresponding to the via cell.

* * * * *